(12) United States Patent
Omura et al.

(10) Patent No.: US 7,557,997 B2
(45) Date of Patent: Jul. 7, 2009

(54) IMMERSION OBJECTIVE OPTICAL SYSTEM, EXPOSURE APPARATUS, DEVICE FABRICATION METHOD, AND BOUNDARY OPTICAL ELEMENT

(75) Inventors: Yasuhiro Omura, Kainosu (JP); Hironori Ikezawa, Fukaya (JP)

(73) Assignee: Nikon Corporation, Tokyo (JP)

( * ) Notice: Subject to any disclaimer, the term of this patent is extended or adjusted under 35 U.S.C. 154(b) by 179 days.

(21) Appl. No.: 11/889,180

(22) Filed: Aug. 9, 2007

(65) Prior Publication Data
US 2008/0080067 A1    Apr. 3, 2008

Related U.S. Application Data

(60) Provisional application No. 60/847,611, filed on Sep. 28, 2006, provisional application No. 60/878,071, filed on Jan. 3, 2007.

(51) Int. Cl.
*G02B 3/00* (2006.01)
*G02B 9/12* (2006.01)
(52) U.S. Cl. .................. 359/649; 359/651; 359/784
(58) Field of Classification Search ......... 359/649–651, 359/656, 661, 784
See application file for complete search history.

(56) References Cited

U.S. PATENT DOCUMENTS

| | | | |
|---|---|---|---|
| 7,466,489 B2 * | 12/2008 | Beder et al. ................ | 359/649 |
| 2006/0012885 A1 | 1/2006 | Beder et al. | |
| 2006/0146411 A1 | 7/2006 | Schuster | |
| 2006/0244938 A1 | 11/2006 | Schuster | |
| 2006/0256447 A1 | 11/2006 | Dodoc | |
| 2007/0091451 A1 | 4/2007 | Schuster | |

FOREIGN PATENT DOCUMENTS

| | | |
|---|---|---|
| EP | 1 701 179 A1 | 9/2006 |
| EP | 1 783 525 A1 | 5/2007 |
| JP | A 8-313842 | 11/1996 |
| JP | A 10-303114 | 11/1998 |
| JP | A 2004-304135 | 10/2004 |
| WO | WO 99/49504 | 9/1999 |
| WO | WO 2005/059617 A2 | 6/2005 |
| WO | WO 2005/059618 A2 | 6/2005 |
| WO | WO 2005/059645 A2 | 6/2005 |
| WO | WO 2005/106589 A1 | 11/2005 |
| WO | WO 2006/013734 A1 | 2/2006 |
| WO | WO 2006/089738 A1 | 8/2006 |
| WO | WO 2007/071565 A1 | 6/2007 |

\* cited by examiner

*Primary Examiner*—William C Choi
*Assistant Examiner*—Jack Dinh
(74) *Attorney, Agent, or Firm*—Oliff & Berridge, PLC

(57) ABSTRACT

In a liquid immersion type projection optical system for forming an image of a first plane on a second plane, an optical path between the optical system and the second plane is filled with a liquid having the refractive index larger than 1.5, and the optical system has a boundary optical element whose surface on the first plane side is in contact with a gas and whose surface on the second plane side is in contact with the liquid. The optical system satisfies the condition of $3.2 < Nb \cdot Eb/|Rb| < 4.0$, where Rb is a radius of curvature of the surface on the first plane side of the boundary optical element, Eb an effective diameter of the surface on the first plane side of the boundary optical element, and Nb a refractive index for used light, of an optical material forming the boundary optical element.

26 Claims, 15 Drawing Sheets

MERIDIONAL    SAGITTAL

Y=12.55mm

Y=8.0mm

Y=6.0mm

MERIDIONAL  SAGITTAL

US 7,557,997 B2

IMMERSION OBJECTIVE OPTICAL SYSTEM, EXPOSURE APPARATUS, DEVICE FABRICATION METHOD, AND BOUNDARY OPTICAL ELEMENT

CROSS-REFERENCE TO RELATED APPLICATIONS

This application is based upon and claims the benefit of priorities from U.S. Provisional Application No. 60/847,611, filed on Sep. 28, 2006, and U.S. Provisional Application No. 60/878,071, filed on Jan. 3, 2007, the entire contents of which are incorporated herein by reference.

BACKGROUND

1. Field

One embodiment of the present invention relates to an immersion objective optical system, exposure apparatus, device fabrication method, and boundary optical element and, more particularly, to a projection optical system applicable to exposure apparatus used in fabrication of devices such as semiconductor devices and liquid-crystal display devices, by photolithography.

2. Description of the Related Art

The photolithography step for fabrication of semiconductor devices or the like is carried out using an exposure apparatus for projecting a pattern image of a mask (or reticle) onto a photosensitive substrate (wafer, glass plate, or the like coated with a photoresist) through a projection optical system to effect exposure thereof. In the exposure apparatus, the demanded resolving power (resolution) of the projection optical system is becoming higher and higher with improvement in the degree of integration of the semiconductor devices or the like.

For improving the resolving power of the projection optical system, it is possible to decrease the wavelength $\lambda$ of illumination light (exposure light) and to increase the image-side numerical aperture NA of the projection optical system. Specifically, the resolution of the projection optical system is expressed by $k \cdot \lambda/NA$ (where k is a process factor). Furthermore, the image-side numerical aperture NA is expressed by $n \cdot \sin \theta$, where n is the refractive index of the medium (normally, gas such as air) between the projection optical system and the photosensitive substrate and $\theta$ a maximum angle of incidence to the photosensitive substrate.

SUMMARY

An embodiment of the present invention provides a liquid immersion type projection optical system capable of securing, for example, a large image-side numerical aperture of about 1.7 and good imaging performance. Another embodiment of the present invention provides an exposure apparatus capable of performing high-accuracy projection exposure of a fine pattern, using a high-resolution projection optical system with a large image-side numerical aperture and with good imaging performance.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

The immersion objective optical system in accordance with an embodiment of the present invention is an immersion objective optical system for making a first plane and a second plane optically conjugate with each other, wherein when a gas in the immersion objective optical system has a refractive index of 1 for used light, an optical path between the immersion objective optical system and the second plane is filled with a liquid having a refractive index larger than 1.5 for the used light, the immersion objective optical system comprising a boundary optical element whose surface on the first plane side is in contact with the gas and whose surface on the second plane side is in contact with the liquid, the immersion objective optical system satisfying the following condition: $3.2 < Nb \cdot Eb/|Rb| < 4.0$, where Rb is a radius of curvature of the surface on the first plane side of the boundary optical element, Eb an effective diameter of the surface on the first plane side of the boundary optical element, and Nb a refractive index for the used light, of an optical material forming the boundary optical element.

The immersion objective optical system in accordance with another embodiment of the present invention is an immersion objective optical system for making a first plane and a second plane optically conjugate with each other, wherein when a gas in the immersion objective optical system has a refractive index of 1 for used light, an optical path between the immersion objective optical system and the second plane is filled with a liquid having a refractive index larger than 1.5 for the used light, the immersion objective optical system comprising a boundary optical element whose surface on the first plane side is in contact with the gas and whose surface on the second plane side is in contact with the liquid, the immersion objective optical system satisfying the following condition: $3.3 < Nb \cdot Sb/|Rb| < 4.15$, where Rb is a radius of curvature of the surface on the first plane side of the boundary optical element, Sb an outer diameter of the surface on the first plane side of the boundary optical element, and Nb a refractive index for the used light, of an optical material forming the boundary optical element.

The exposure apparatus in accordance with another embodiment of the present invention is an exposure apparatus comprising the immersion objective optical system of one of the above embodiments for projecting an image of a predetermined pattern onto a photosensitive substrate set on the second plane, based on light from the pattern set on the first plane.

The device fabrication method in accordance with another embodiment of the present invention is a device fabrication method comprising: effecting exposure of the predetermined pattern on the photosensitive substrate by means of the exposure apparatus of the above embodiment; and developing the exposed photosensitive substrate.

The boundary optical element in accordance with another embodiment of the present invention is a boundary optical element which is used in an immersion objective optical system for making a first plane and a second plane optically conjugate with each other, and whose surface on the first plane side is in contact with a gas and whose surface on the second plane side is in contact with a liquid, wherein when the gas has a refractive index of 1 for used light, the liquid on the second plane side of the boundary optical element has a refractive index larger than 1.5 for the used light, the boundary optical element satisfying the following condition: $3.2 < Nb \cdot Eb/|Rb| < 4.0$, where Rb is a radius of curvature of the surface on the first plane side of the boundary optical element, Eb an effective diameter of the surface on the first plane side of the boundary optical element, and Nb a refractive index for the used light, of an optical material forming the boundary optical element.

The boundary optical element in accordance with another embodiment of the present invention is a boundary optical element which is used in an immersion objective optical system for making a first plane and a second plane optically conjugate with each other, and whose surface on the first plane side is in contact with a gas and whose surface on the second plane side is in contact with a liquid, wherein when the gas has a refractive index of 1 for used light, the liquid on the second plane side of the boundary optical element has a refractive index larger than 1.5 for the used light, the boundary optical element satisfying the following condition: $3.3 < Nb \cdot Sb/|Rb| < 4.15$, where Rb is a radius of curvature of the surface on the first plane side of the boundary optical element, Sb an outer diameter of the surface on the first plane side of the boundary optical element, and Nb a refractive index for the used light, of an optical material forming the boundary optical element.

In the immersion objective optical system of the above embodiments, for example, in a liquid immersion type projection optical system for forming an image of a first plane on a second plane, the optical path between the optical system and the second plane is filled with the liquid having the refractive index larger than 1.5, and the boundary optical element with the surface on the first plane side in contact with the gas and with the surface on the second plane side in contact with the liquid satisfies the required condition. As a result, the optical system is able to secure a large image-side numerical aperture, e.g., about 1.7, while avoiding increase in the size of the optical system and well compensating for aberration in the image plane.

Namely, the above embodiments successfully realized the liquid immersion type projection optical system capable of ensuring, for example, the large image-side numerical aperture of about 1.7 and good imaging performance. The exposure apparatus of the above embodiment is able to perform the high-accuracy projection exposure of a fine pattern and, therefore, to fabricate good devices with high accuracy, using the high-resolution projection optical system with the large image-side numerical aperture and with good imaging performance.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION

Figure 1:
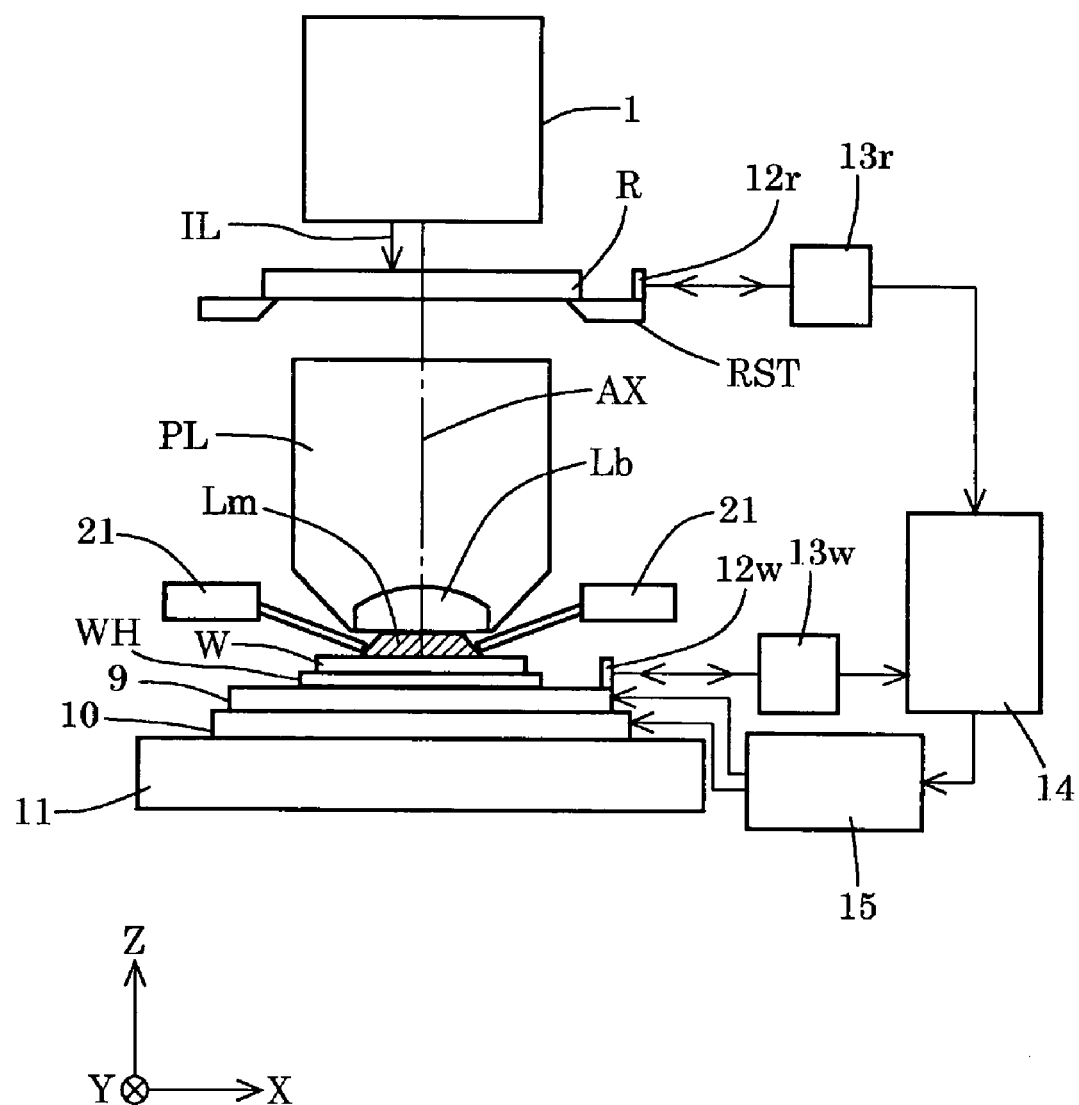
FIG. 1 is a drawing schematically showing a configuration of an exposure apparatus according to an embodiment of the present invention.

An immersion objective optical system according to an embodiment of the present invention is an optical system for making a first plane and a second plane optically conjugate with each other, in which an optical path between the optical system and the second plane is filled with a liquid having a refractive index larger than 1.5 for used light (while the gas in the optical system has the refractive index of 1 for the used light) when the optical system is used. For easier description, the following will concern a liquid immersion type projection optical system mounted, for example, on an exposure apparatus and adapted to form a reduced image of a pattern surface (first plane) of a mask on an exposed surface (second plane) of a photosensitive substrate (wafer).

The projection optical system of an embodiment of the present invention has an optical element (an boundary optical element, a boundary lens) whose surface on the image side (second plane side; wafer side) is in contact with the liquid (immersion liquid) and whose surface on the object side (first plane side; mask side) is in contact with the gas, and this boundary optical element satisfies at least one of Conditions (1) and (2) below. In Condition (1), Rb is a radius of curvature of the surface on the object side (first plane side) of the boundary optical element, Eb an effective diameter (diameter) of the surface on the object side (first plane side) of the boundary optical element, and Nb a refractive index for the used light (exposure light), of an optical material forming the boundary optical element.

$$3.2 < Nb \cdot Eb/|Rb| < 4.0 \qquad (1)$$

In Condition (2), Rb is the radius of curvature of the surface on the object side (first plane side) of the boundary optical element, Sb an outer diameter (diameter) of the surface on the object side (first plane side) of the boundary optical element, and Nb the refractive index for the used light (exposure light), of the optical material forming the boundary optical element.

$$3.3 < Nb \cdot Sb/|Rb| < 4.15 \qquad (2)$$

In the projection optical system of an embodiment of the present invention, the boundary optical element may have a large refractive power, in order to make rays corresponding to the image-side numerical aperture of about 1.7, propagate up to the wafer. In cases where the transmittance of the liquid is insufficient, the surface on the image side (wafer side) of the boundary optical element may be formed in a nearly planar shape, in order to make the pupil intensity distribution (light intensity distribution formed on the pupil plane of the projection optical system by a bundle of rays reaching a point on the image plane) uniform across the entire effective imaging region (corresponding to a still exposure region of the exposure apparatus) on the image plane. Therefore, the surface on the object side (mask side) of the boundary optical element may have such a refractive power as to satisfy at least one condition of Conditions (1) and (2).

When the ratio is smaller than the lower limit of Condition (1), the magnitude |Rb| of the radius of curvature of the surface on the object side of the boundary optical element will be too large to achieve a sufficient refractive power of the boundary optical element. As a result, in order to achieve the desired image-side numerical aperture, the optical system will increase its radial size to an unmanufacturable level and also increase its axial size. For better exercising the effect of the present invention an embodiment of, the lower limit of Condition (1) may be set to 3.35.

When the ratio is larger than the upper limit of Condition (1), the magnitude |Rb| of the radius of curvature of the surface on the object side of the boundary optical element will be so small as to make the refractive power of the boundary optical element too large. As a result, it becomes difficult to compensate for aberration in the image plane (coma, distortion, etc.) and it becomes difficult to support (or hold) the boundary optical element. For better exercising the effect of an embodiment of the present invention, the upper limit of Condition (1) may be set to 3.85.

When the ratio is smaller than the lower limit of Condition (2), the magnitude |Rb| of the radius of curvature of the surface on the object side of the boundary optical element will be too large to achieve a sufficient refractive power of the boundary optical element. As a result, in order to achieve the desired image-side numerical aperture, the optical system will increase its radial size to an unmanufacturable level and also increase its axial size. For better exercising the effect of an embodiment of the present invention, the lower limit of Condition (2) may be set to 3.4.

When the ratio is larger than the upper limit of Condition (2), the magnitude |Rb| of the radius of curvature of the surface on the object side of the boundary optical element will be so small as to make the refractive power of the boundary optical element too large. As a result, it becomes difficult to compensate for aberration in the image plane (coma, distortion, etc.) and it becomes difficult to support (or hold) the boundary optical element. For better exercising the effect of an embodiment of the present invention, the upper limit of Condition (2) may be set to 4.0.

The projection optical system of an embodiment of the present invention may satisfy Condition (3) below. In Condition (3), Rb is the radius of curvature of the surface on the object side (first plane side) of the boundary optical element and Yi a maximum image height on the image plane (second plane). However, when an embodiment of the present invention is applied to the immersion objective optical system for making the first plane and the second plane optically conjugate with each other, Yi is a maximum image height on the second plane or a maximum object height on the second plane. When the immersion objective optical system for forming an image of the first plane onto the second plane, Yi is regarded as the maximum image height, and when the immersion objective optical system for forming an image of the second plane onto the first plane, Yi is regarded as the maximum object height.

$$0.12 < Yi/|Rb| < 0.3 \tag{3}$$

The projection optical system mounted on the exposure apparatus is required to ensure a large maximum image height Yi, in order to improve the throughput. However, the projection optical system may satisfy Condition (3), in order to avoid increase in the size of the optical system and well compensate for aberration in the image plane. Specifically, when the ratio is smaller than the lower limit of Condition (3), the magnitude |Rb| of the radius of curvature of the surface on the object side of the boundary optical element will be too large to achieve a sufficient refractive power of the boundary optical element. As a result, in order to achieve the desired image-side numerical aperture, the optical system will increase its radial size to an unmanufacturable level and also increase its axial size. For better exercising the effect of an embodiment of the present invention, the lower limit of Condition (3) may be set to 0.13.

When the ratio is larger than the upper limit of Condition (3), the magnitude |Rb| of the radius of curvature of the surface on the object side of the boundary optical element will be so small as to make the refractive power of the boundary optical element too large. As a result, it becomes difficult to compensate for aberration in the image plane (coma, distortion, etc.) and it becomes difficult to support (or hold) the boundary optical element. For better exercising the effect of an embodiment of the present invention, the upper limit of Condition (3) may be set to 0.25.

The projection optical system of an embodiment of the present invention may be an off-axis field type optical system having the field in a region located apart from the optical axis, and thrice imaging type catadioptric system. Specifically, the projection optical system of an embodiment of the present invention may comprise a first imaging optical system of a dioptric type located between a first conjugate position optically conjugate with the first plane, and the first plane; a second imaging optical system located between a second conjugate position optically conjugate with the first conjugate position, and the first conjugate position, and including at least one concave reflecting mirror; and a third imaging optical system of a dioptric type located between the second conjugate position and the second plane.

In other words, the projection optical system of an embodiment of the present invention may comprise the first imaging optical system for forming a first intermediate image of a pattern located on the object plane (first plane); the second imaging optical system for forming a second intermediate image of the pattern (which is an image of the first intermediate image and secondary image of the pattern) on the basis of light from the first intermediate image; and the third imaging optical system for forming a final image of the pattern on the image plane (second plane) on the basis of light from the second intermediate image.

In general, in the case of the projection optical system with a large image-side numerical aperture, not only of the liquid immersion type, but also of a dry type, the catadioptric system may be adopted from the viewpoint of satisfying the Petzval's condition to achieve flatness of image and the off-axis field type optical system may be adopted from the viewpoint of compatibility with every fine pattern. Particularly, in the case of the off-axis field type and thrice imaging type catadioptric system, it is easy to separate incident rays to a concave reflecting mirror located between formed positions of the two intermediate images, from emergent rays from the concave reflecting mirror.

In an embodiment of the present invention, the foregoing off-axis field type and thrice imaging type catadioptric system may be so arranged that a folding mirror is located in at least one optical path out of an optical path from the first imaging optical system to the second imaging optical system and an optical path from the second imaging optical system to the third imaging optical system. This arrangement of the folding mirror further facilitates the ray separation between incident rays to the concave reflecting mirror and emergent rays from the concave reflecting mirror, based on the simple configuration.

In an embodiment of the present invention, the second imaging optical system of the foregoing off-axis field type and thrice imaging type catadioptric system may include two concave reflecting surfaces facing each other. This arrangement can facilitate the ray separation between incident rays to the concave reflecting surface and emergent rays from the concave reflecting surface.

In an embodiment of the present invention, the aforementioned off-axis field type and thrice imaging type catadioptric system with the folding mirror may satisfy Conditions (4) and (5) below. In Conditions (4) and (5), M1 is an imaging magnification of the first imaging optical system and M12 a composite imaging magnification of the first imaging optical system and the second imaging optical system.

$$1.1 < |M1| < 1.7 \quad (4)$$

$$1.1 < |M12| < 1.7 \quad (5)$$

When the imaging magnifications are smaller than the lower limits of Conditions (4) and (5), the incidence angle range of rays to the folding mirror will be too large to maintain desired reflectance across the entire effective reflecting surface. For better exercising the effect of an embodiment of the present invention, the lower limits of Conditions (4) and (5) may be set to 1.2.

When the imaging magnifications are larger than the upper limits of Conditions (4) and (5), the required reflecting surface of the folding mirror will be too large to locate the mirror in the projection optical system and it will result in failure in implementation of the maximum image height of the desired size. For better exercising the effect of an embodiment of the present invention, the upper limits of Conditions (4) and (5) may be set to 1.5.

An embodiment of the present invention will be described on the basis of the accompanying drawings. FIG. 1 is a drawing schematically showing a configuration of an exposure apparatus according to the embodiment of the present invention. In FIG. 1, the X-axis and the Y-axis are set along directions parallel to a wafer W, and the Z-axis is set along a direction perpendicular to the wafer W. More specifically, the XY plane is set in parallel with the horizontal plane and the +Z-axis is set upward along the vertical direction.

The exposure apparatus of the present embodiment, as shown in FIG. 1, has an illumination optical system 1 including, for example, an ArF excimer laser light source as an exposure light source and comprised of an optical integrator (homogenizer), a field stop, a condenser lens, and so on. Exposure light (exposure beam) IL consisting of ultraviolet pulsed light of the wavelength of 193 nm emitted from the light source travels through the illumination optical system 1 to illuminate a reticle (mask) R. A pattern to be transferred is formed in the reticle R, and the reticle R is illuminated in a pattern region of a rectangular shape (slit shape) having longer sides along the X-direction and shorter sides along the Y-direction in the entire pattern region.

The light having passed through the reticle R travels through a liquid immersion type catadioptric projection optical system PL to form a reticle pattern at a predetermined projection magnification in an exposure region on a wafer (photosensitive substrate) W coated with a photoresist. Namely, a pattern image is formed in a still exposure region (effective exposure region; effective imaging region) of a rectangular shape having longer sides along the X-direction and shorter sides along the Y-direction on the wafer W, so as to optically correspond to the rectangular illumination region on the reticle R.

Figure 2:
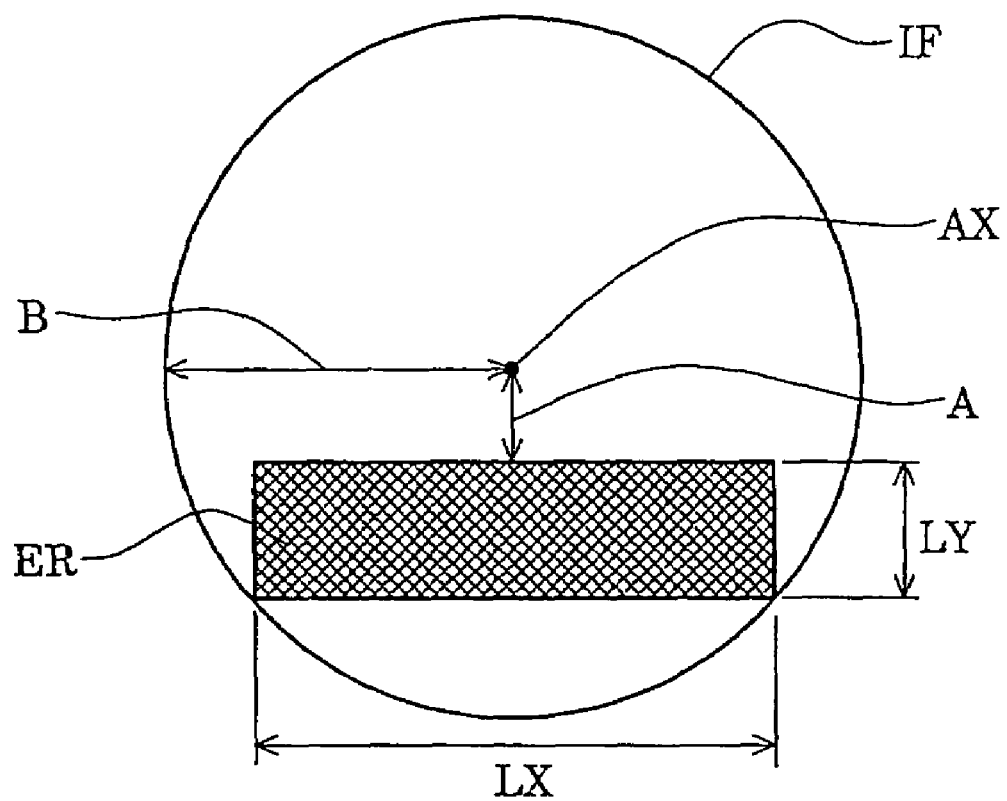
FIG. 2 is a drawing showing a positional relation between a rectangular still exposure region formed on a wafer, and a reference optical axis in the embodiment.

FIG. 2 is a drawing showing a positional relation between a rectangular still exposure region formed on the wafer, and a reference optical axis in the present embodiment. In the present embodiment, as shown in FIG. 2, the rectangular still exposure region ER having a desired size is set at a position an off-axis amount A apart in the Y-direction from the reference optical axis AX, in a circular region (image circle) IF centered on the reference optical axis AX and having a radius B. The X-directional length of the still exposure region ER is defined as LX and the Y-directional length thereof as LY. Although not shown, a rectangular illumination region having the size and shape corresponding to the still exposure region ER is formed at a position a distance corresponding to the off-axis amount A apart in the Y-direction from the reference optical axis AX, corresponding to the rectangular still exposure region ER, on the reticle R.

The reticle R is held in parallel with the XY plane on a reticle stage RST, and a mechanism for finely moving the reticle R in the X-direction, in the Y-direction, and in the direction of rotation is incorporated in the reticle stage RST. A reticle laser interferometer 13r using a moving mirror 12r provided on the reticle stage RST measures positions of the reticle stage RST in the X-direction, in the Y-direction, and in the direction of rotation in real time and the reticle stage RST is controlled based on the result of the measurement. The wafer W is fixed in parallel with the XY plane through a wafer holder WH on a Z-stage 9.

The Z-stage 9 is fixed on an XY stage 10 adapted to move along the XY plane substantially parallel with the image plane of the projection optical system PL, and controls a focus position (position in the Z-direction) and an angle of inclination of the wafer W. A wafer laser interferometer 13w using a moving mirror 12w provided on the Z-stage 9 measures positions of the Z-stage 9 in the X-direction, in the Y-direction, and in the direction of rotation in real time, and the Z-stage 9 is controlled based on the result of the measurement. The XY stage 10 is mounted on a base 11 and controls the X-direction, Y-direction, and direction of rotation of the wafer W.

On the other hand, a main control system 14 provided in the exposure apparatus of the present embodiment performs adjustment of the positions of the reticle R in the X-direction, in the Y-direction, and in the direction of rotation, based on measured values by the reticle laser interferometer 13r. Namely, the main control system 14 transmits a control signal to the mechanism incorporated in the reticle stage RST, to finely move the reticle stage RST to adjust the position of the reticle R. Furthermore, the main control system 14 performs adjustment of the focus position (position in the Z-direction) and angle of inclination of the wafer W in order to match the front surface on the wafer W with the image plane of the projection optical system PL by the autofocus method and autoleveling method.

Specifically, the main control system 14 transmits a control signal to a wafer stage driving system 15 to drive the Z-stage 9 by the wafer stage driving system 15 to adjust the focus position and inclination angle of the wafer W. Furthermore, the main control system 14 performs adjustment of the positions of the wafer W in the X-direction, in the Y-direction, and in the direction of rotation, based on measured values by the wafer laser interferometer 13. Specifically, the main control system 14 transmits a control signal to the wafer stage driving system 15 to drive the XY stage 10 by the wafer stage driving system 15 to adjust the positions of the wafer W in the X-direction, in the Y-direction, and in the direction of rotation.

During exposure, the main control system 14 transmits a control signal to the mechanism incorporated in the reticle stage RST and transmits a control signal to the wafer stage driving system 15 to implement projection exposure of the pattern image of the reticle R in a predetermined shot area on the wafer W while driving the reticle stage RST and XY stage 10 at a speed ratio according to the projection magnification of the projection optical system PL. Thereafter, the main control system 14 transmits a control signal to the wafer stage driving system 15 to drive the XY stage 10 by the wafer stage driving system 15 to effect step movement of another shot area on the wafer W to the exposure position.

In this manner, the scanning exposure operation of the pattern image of the reticle R on the wafer W is repeated by the step-and-scan method. Namely, the present embodiment is arranged to synchronously move (scan) the reticle stage RST and XY stage 10 and, therefore, the reticle R and wafer W along the shorter-side direction or Y-direction of the rectangular still exposure region and still illumination region, while controlling the positions of the reticle R and wafer W with the wafer stage driving system 15 and the wafer laser interferometer 13 or the like, whereby scanning exposure of the reticle pattern is implemented in a region having a width equal to the longer sides LX of the still exposure region and a length according to a scanning distance (movement distance) of the wafer W, on the wafer W.

Figure 3:
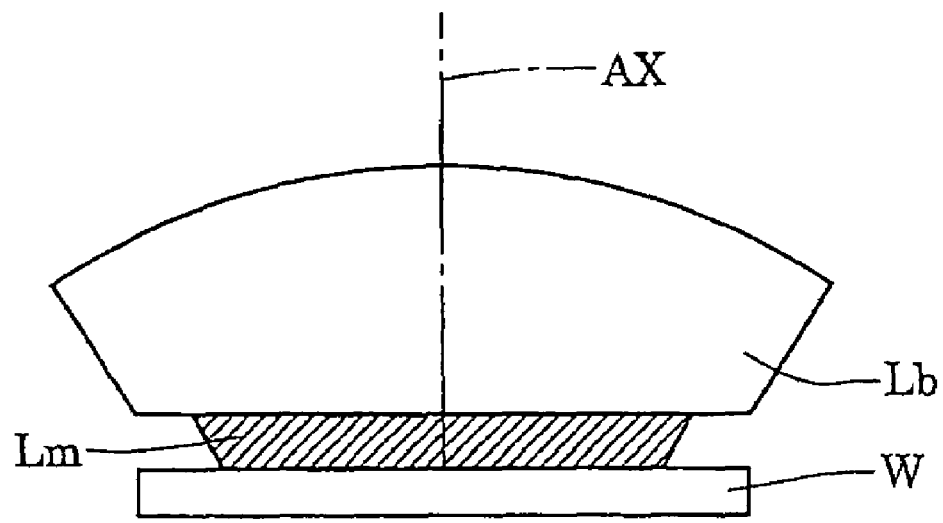
FIG. 3 is a drawing schematically showing a configuration between a boundary lens and a wafer in each example of the embodiment.

FIG. 3 is a drawing schematically showing a configuration between the boundary lens and the wafer in each of examples of the present embodiment. In the present embodiment, as shown in FIG. 3, the optical path between the boundary lens Lb and the wafer W is filled with a liquid Lm having the refractive index larger than 1.5 for the exposure light. The boundary lens Lb is a positive lens whose convex surface is directed toward the reticle R and whose plane is directed toward the wafer W. In the present embodiment, as shown in FIG. 1, a supply/discharge mechanism 21 is used to circulate the liquid Lm in the optical path between the boundary lens Lb and the wafer W.

In the exposure apparatus of the step-and-scan method for implementing scanning exposure with relative movement of the wafer W to the projection optical system PL, the optical path between the boundary lens Lb of the projection optical system PL and the wafer W can be kept filled with the liquid Lm from start to finish of the scanning exposure, for example, by using the technology disclosed in International Publication WO99/49504, the technology disclosed in Japanese Patent Application Laid-Open No. 10-303114, and so on. In the technology disclosed in International Publication WO99/49504, the liquid controlled at a predetermined temperature is supplied from a liquid supply device through a supply tube and discharge nozzle so as to fill the optical path between the boundary lens Lb and the wafer W, and the liquid is recovered from on the wafer W through a recovery tube and inflow nozzle by the liquid supply device.

On the other hand, the technology disclosed in Japanese Patent Application Laid-Open No. 10-303114 adopts a wafer holder table formed in a receptacle shape so as to store the liquid, and positions and holds the wafer W in the center of the inner bottom of the table (in the liquid) by vacuum suction. The system is so arranged that the tip of the barrel of the projection optical system PL reaches the interior of the liquid and thus that the optical surface on the wafer side of the boundary lens Lb reaches the interior of the liquid. By circulating the liquid as an immersion liquid at a small flow rate in this manner, it becomes feasible to prevent alteration of the liquid by effects of antisepsis, mold prevention, and so on. It is also feasible to prevent variation in aberration due to absorption of heat of the exposure light. International Publication WO99/49504 and Japanese Patent Application Laid-Open No. 10-303114 are incorporated herein by reference.

In each example of the present embodiment, each aspherical surface is expressed by Formula (a) below, where y represents a height in the direction perpendicular to the optical axis, z a distance (sag) along the optical axis from a tangent plane at a vertex of the aspherical surface to a position on the aspherical surface at the height y, r a radius of curvature at the vertex, κ the conical coefficient, and $C_n$ an aspherical coefficient of nth order. In Tables (1) to (3) below, each lens surface formed in an aspherical shape is accompanied by mark * to the right side of its surface number.

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14}+C_{16}\cdot y^{16} \quad (a)$$

In each example, the projection optical system PL has a first imaging optical system G1 for forming a first intermediate image of a pattern of reticle R placed on the object plane (first plane); a second imaging optical system G2 for forming a second intermediate image of the reticle pattern (image of the first intermediate image and secondary image of the reticle pattern) on the basis of light from the first intermediate image; and a third imaging optical system G3 for forming a final image of the reticle pattern (reduced image of the reticle pattern) on a wafer W placed on the image plane (second plane) on the basis of light from the second intermediate image. The first imaging optical system G1 and the third imaging optical system G3 both are refracting optical systems, and the second imaging optical system G2 is a catadioptric system including a concave reflecting mirror CM.

A first plane mirror (first folding mirror) M1 is located in the optical path between the first imaging optical system G1 and the second imaging optical system G2, and a second plane mirror (second folding mirror) M2 is located in the optical path between the second imaging optical system G2 and the third imaging optical system G3. In the projection optical system PL of each example in the above configuration, the light from the reticle R travels through the first imaging optical system G1 to form the first intermediate image of the reticle pattern near the first plane mirror M1 in the optical path between the first plane mirror M1 and the second imaging optical system G2. The light from the first intermediate image travels through the second imaging optical system G2 to form the second intermediate image of the reticle pattern near the second plane mirror M2 in the optical path between the second plane mirror M2 and the second imaging optical system G2. The light from the second intermediate image travels through the third imaging optical system G3 to form the final image of the reticle pattern on the wafer W.

In the projection optical system PL of each example, the first imaging optical system G1 and the third imaging optical system G3 have their respective optical axes AX1 and AX3 extending linearly along the vertical direction, and the optical axis AX1 and the optical axis AX3 agree with the reference optical axis AX. On the other hand, the second imaging optical system G2 has the optical axis AX2 (perpendicular to the reference optical axis AX) extending linearly along the horizontal direction. In this way, the reticle R, the wafer W, all the optical members constituting the first imaging optical system G1, and all the optical members constituting the third imaging optical system G3 are arranged in parallel with each other along the plane perpendicular to the direction of gravity, i.e., along the horizontal plane. Furthermore, the first plane mirror M1 and the second plane mirror M2 have their respective reflecting surfaces set at the angle of 45° relative to the reticle surface, and the first plane mirror M1 and the second plane mirror M2 are integrally constructed as one optical member. In each example, the projection optical system PL is arranged as substantially telecentric on both of the object side and the image side.

FIRST EXAMPLE

Figure 4:
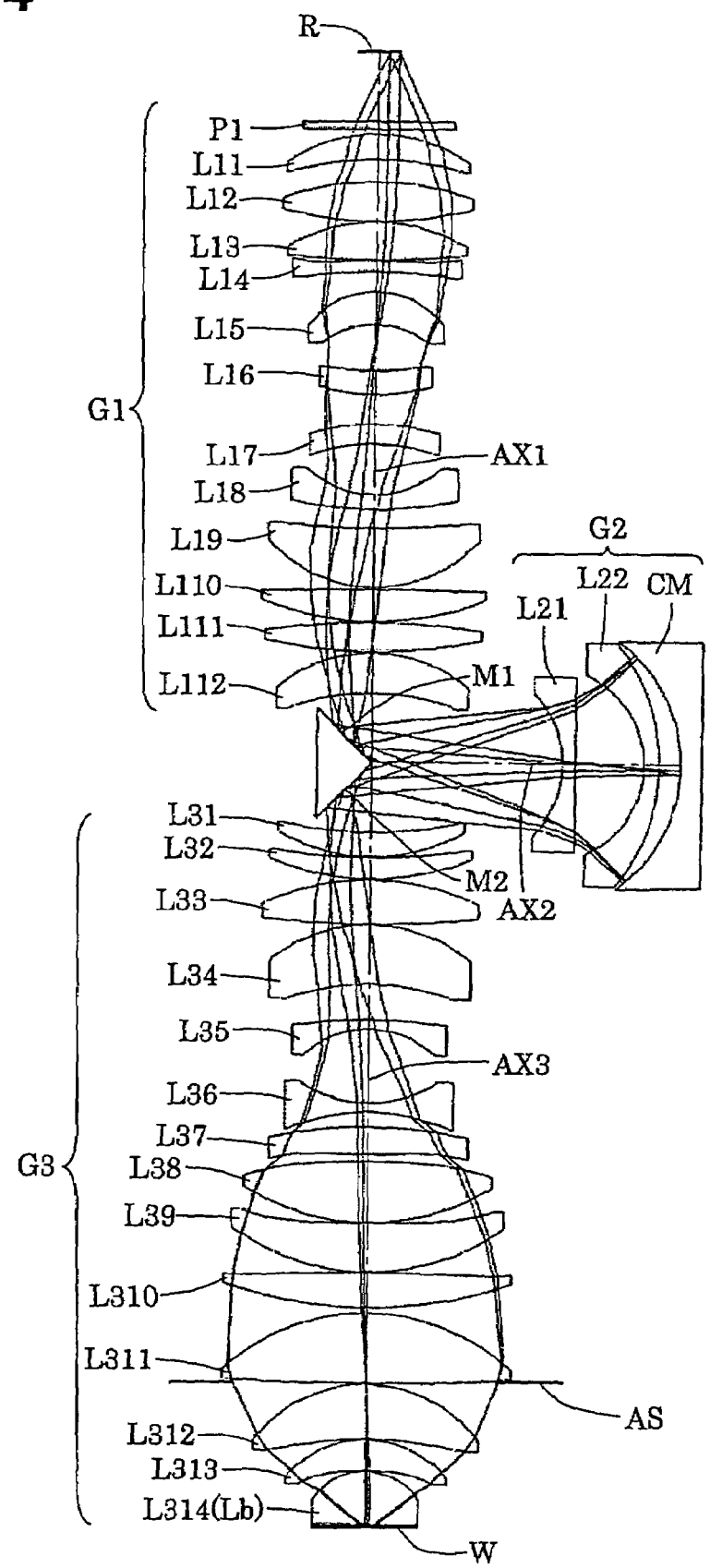
FIG. 4 is a drawing showing a lens configuration of a projection optical system according to the first example of the embodiment.

FIG. 4 is a drawing showing a lens configuration of the projection optical system according to the first example of the present embodiment. In the projection optical system PL according to the first example, the first imaging optical system G1 is composed of the following elements in the order named from the reticle side: plane-parallel plate P1, positive meniscus lens L11 whose convex surface is directed toward the reticle, biconvex lens L12, biconvex lens L13, lens L14 whose aspherical surface is directed toward the reticle, positive meniscus lens L15 whose convex surface is directed toward the reticle, positive meniscus lens L16 whose concave surface is directed toward the reticle, negative meniscus lens L17 whose convex surface is directed toward the reticle, negative meniscus lens L18 whose concave surface of an aspherical shape is directed toward the reticle, positive meniscus lens L19 whose concave surface is directed toward the reticle, positive lens L110 whose aspherical surface is directed toward the reticle, biconvex lens L111, and positive meniscus lens L112 whose concave surface of an aspherical shape is directed toward the wafer.

The second imaging optical system G2 is composed of the following elements in the order named from the entrance side of light along the outward traveling path of light: biconcave lens L21, negative meniscus lens L22 whose concave surface is directed toward the entrance side, and concave reflecting mirror CM whose concave surface is directed toward the entrance side. The third imaging optical system G3 is composed of the following elements in the order named from the reticle side (or the entrance side of light): positive meniscus lens L31 whose concave surface is directed toward the reticle, positive meniscus lens L32 whose concave surface is directed toward the reticle, biconvex lens L33 whose convex surface of an aspherical shape is directed toward the wafer, positive meniscus lens L34 whose convex surface is directed toward the reticle, negative meniscus lens L35 whose convex surface is directed toward the reticle, biconcave lens L36 whose concave surface of an aspherical shape is directed toward the wafer, positive lens L37 whose aspherical surface is directed toward the wafer, biconvex lens L38 whose convex surface of an aspherical shape is directed toward the reticle, positive meniscus lens L39 whose concave surface of an aspherical shape is directed toward the reticle, biconvex lens L310 whose convex surface of an aspherical shape is directed toward the reticle, biconvex lens L311 whose convex surface of an aspherical shape is directed toward the wafer, aperture stop AS, positive meniscus lens L312 whose concave surface of an aspherical shape is directed toward the wafer, positive meniscus lens L313 whose concave surface of an aspherical shape is directed toward the wafer, and plano-convex lens L314 (boundary lens Lb) whose plane is directed toward the wafer.

In the first example, the optical path between the boundary lens Lb and the wafer W is filled with a high-index liquid Lm (not shown in FIG. 4) having the refractive index of 1.8 for the ArF excimer laser light (center wavelength $\lambda$=193.306 nm) being used light (exposure light). This high-index liquid Lm applicable herein is, for example, a hydrocarbon type medium (liquid). The boundary lens Lb is made of Lutetium Aluminum Garnet crystal (LuAG) having the refractive index of 2.1435 for the center wavelength of the used light. The optically transparent members (plane-parallel plate P1, and lenses L11-L12, L21, L22, L31-L313) other than the boundary lens Lb are made of quartz ($SiO_2$) having the refractive index of 1.5603261 for the center wavelength of the used light.

Table (1) below presents values of specifications of the projection optical system PL according to the first example. In the column of principal specifications in Table (1), $\lambda$ represents the center wavelength of the exposure light, $\beta$ the magnitude (absolute value) of the projection magnification (imaging magnification of the entire system), NA the image-side (wafer-side) numerical aperture, B the radius of the image circle IF (maximum image height Yi) on the wafer W, A the off-axis amount of the still exposure region ER, LX the length along the X-direction of the still exposure region ER (the length of the longer sides), and LY the length along the Y-direction of the still exposure region ER (the length of the shorter sides).

In the column of the specifications of the optical members in Table (1), the surface number represents an order of each surface from the reticle side along the traveling path of rays from the reticle surface as the object plane (first plane) to the wafer surface as the image plane (second plane), r the radius of curvature of each surface (in the case of an aspherical surface, a radius of curvature at a vertex: mm), d an axial distance or surface separation (mm) of each surface, and n the refractive index for the center wavelength. Signs for the surface separation d are defined as negative in the optical path from the concave reflecting mirror CM to the second plane mirror M2 and as positive in the other optical paths.

In the first imaging optical system G1, a radius of curvature of a convex surface directed toward the reticle (entrance side of light) is defined as positive, and a radius of curvature of a concave surface directed toward the reticle, as negative. In the second imaging optical system G2, a radius of curvature of a concave surface directed toward the entrance side of light along the outward traveling path of light is defined as negative, and a radius of curvature of a convex surface directed toward the entrance side of light, as positive. In the third imaging optical system G3, a radius of curvature of a convex surface directed toward the reticle (entrance side of light) is defined as positive, and a radius of curvature of a concave surface directed toward the reticle, as negative. The notation in Table (1) also applies similarly to Table (2) and Table (3) hereinafter.

TABLE (1)

(PRINCIPAL SPECIFICATION)

$\lambda$ = 193.306 nm
$\beta$ = ¼
NA = 1.7
B = 12.53 mm
A = 3 mm

TABLE (1)-continued

LX = 22 mm
LY = 3 mm (SPECIFICATIONS OF OPTICAL MEMBERS)

| SURFACE NO. | r | d | n | OPTICAL MEMBER |
|---|---|---|---|---|
|  | (RETICLE SURFACE) | 77.68699 |  |  |
| 1 | ∞ | 8.00000 | 1.5603261 | (P1) |
| 2 | ∞ | 5.99804 |  |  |
| 3 | 191.78217 | 27.80620 | 1.5603261 | (L11) |
| 4 | 357.26950 | 25.69450 |  |  |
| 5 | 338.29471 | 44.22623 | 1.5603261 | (L12) |
| 6 | −447.13457 | 1.00000 |  |  |
| 7 | 205.69118 | 43.81913 | 1.5603261 | (L13) |
| 8 | −1019.97296 | 1.00000 |  |  |
| 9* | 837.31056 | 12.50969 | 1.5603261 | (L14) |
| 10 | 612.79058 | 22.84470 |  |  |
| 11 | 98.31575 | 38.50114 | 1.5603261 | (L15) |
| 12 | 107.22865 | 52.97229 |  |  |
| 13 | −315.21213 | 27.98666 | 1.5603261 | (L16) |
| 14 | −210.60474 | 33.31685 |  |  |
| 15 | 272.57977 | 22.77029 | 1.5603261 | (L17) |
| 16 | 225.22872 | 59.75622 |  |  |
| 17* | −107.69711 | 17.60675 | 1.5603261 | (L18) |
| 18 | −409.70711 | 20.87309 |  |  |
| 19 | −1032.54239 | 68.33466 | 1.5603261 | (L19) |
| 20 | −167.05382 | 2.90386 |  |  |
| 21* | 2817.69513 | 37.22144 | 1.5603261 | (L110) |
| 22 | −349.50628 | 1.00000 |  |  |
| 23 | 838.48801 | 33.36135 | 1.5603261 | (L111) |
| 24 | −583.97502 | 1.71680 |  |  |
| 25 | 172.48233 | 47.23959 | 1.5603261 | (L112) |
| 26* | 320.00000 | 81.00000 |  |  |
| 27 | ∞ | 220.00000 |  | (M1) |
| 28 | −123.44114 | 15.00000 | 1.5603261 | (L21) |
| 29 | 7598.76379 | 80.04526 |  |  |
| 30 | −113.56680 | 18.00000 | 1.5603261 | (L22) |
| 31 | −223.60932 | 25.10674 |  |  |
| 32 | −176.92683 | −25.10674 |  | (CM) |
| 33 | −223.60932 | −18.00000 | 1.5603261 | (L22) |
| 34 | −113.56680 | −80.04526 |  |  |
| 35 | 7598.76379 | −15.00000 | 1.5603261 | (L21) |
| 36 | −123.44114 | −220.00000 |  |  |
| 37 | ∞ | 81.00000 |  | (M2) |
| 38 | −430.00000 | 27.58948 | 1.5603261 | (L31) |
| 39 | −222.93419 | 1.00000 |  |  |
| 40 | −713.30219 | 25.71244 | 1.5603261 | (L32) |
| 41 | −299.97724 | 1.00000 |  |  |
| 42 | 301.06922 | 52.22707 | 1.5603261 | (L33) |
| 43 | −1159.97536 | 1.00000 |  |  |
| 44 | 183.95565 | 70.00000 | 1.5603261 | (L34) |
| 45* | 312.52930 | 40.49953 |  |  |
| 46 | 607.96857 | 10.97062 | 1.5603261 | (L35) |
| 47 | 113.09939 | 86.26125 |  |  |
| 48 | −144.19322 | 10.00000 | 1.5603261 | (L36) |
| 49* | 192.84172 | 17.45407 |  |  |
| 50 | 554.07136 | 31.69718 | 1.5603261 | (L37) |
| 51* | −1118.81853 | 8.67428 |  |  |
| 52* | 1003.91527 | 69.19649 | 1.5603261 | (L38) |
| 53 | −281.95511 | 1.00000 |  |  |
| 54* | −1774.62289 | 55.24875 | 1.5603261 | (L39) |
| 55 | −277.22784 | 1.00000 |  |  |
| 56* | 1834.52578 | 38.87499 | 1.5603261 | (L310) |
| 57 | −547.30212 | 6.62312 |  |  |
| 58 | 250.00000 | 81.34467 | 1.5603261 | (L311) |
| 59* | 12706.48030 | 0.00000 |  |  |
| 60 | ∞ | 1.00000 |  | (AS) |
| 61 | 166.15177 | 63.27262 | 1.5603261 | (L312) |
| 62* | 350.56968 | 1.00000 |  |  |
| 63 | 122.54490 | 36.46234 | 1.5603261 | (L313) |
| 64* | 282.95747 | 1.00000 |  |  |
| 65 | 76.52285 | 60.66639 | 2.1435 | (L314:Lb) |
| 66 | ∞ | 3.00000 | 1.8 | (Lm) |
|  | (WAFER SURFACE) |  |  |  |

(ASPHRICAL DATA)

9 TH SURFACE $\kappa = 0$
$C_4 = -7.63790 \times 10^{-8}$
$C_6 = -1.62891 \times 10^{-12}$
$C_8 = 5.55362 \times 10^{-17}$
$C_{10} = -2.39683 \times 10^{-21}$
$C_{12} = -8.47266 \times 10^{-25}$
$C_{14} = 9.08957 \times 10^{-29}$
$C_{16} = -3.00802 \times 10^{-33}$

17 TH SURFACE $\kappa = 0$
$C_4 = 6.00846 \times 10^{-8}$
$C_6 = 2.65139 \times 10^{-13}$
$C_8 = 2.17914 \times 10^{-17}$
$C_{10} = 6.54666 \times 10^{-21}$
$C_{12} = -2.34896 \times 10^{-24}$
$C_{14} = 3.96566 \times 10^{-28}$
$C_{16} = -2.85541 \times 10^{-32}$

21 TH SURFACE $\kappa = 0$
$C_4 = -4.15734 \times 10^{-9}$
$C_6 = -1.54979 \times 10^{-14}$
$C_8 = -1.17596 \times 10^{-18}$
$C_{10} = 1.16093 \times 10^{-22}$
$C_{12} = -3.79603 \times 10^{-27}$
$C_{14} = 4.79263 \times 10^{-32}$
$C_{16} = 0$

26 TH SURFACE $\kappa = 0$
$C_4 = 2.58041 \times 10^{-8}$
$C_6 = -1.95184 \times 10^{-13}$
$C_8 = 9.77464 \times 10^{-18}$
$C_{10} = -1.00591 \times 10^{-22}$
$C_{12} = 6.41700 \times 10^{-27}$
$C_{14} = -1.77985 \times 10^{-31}$
$C_{16} = 2.73152 \times 10^{-36}$

45 TH SURFACE $\kappa = 0$
$C_4 = 1.31589 \times 10^{-8}$
$C_6 = 2.30176 \times 10^{-14}$
$C_8 = 3.60908 \times 10^{-18}$
$C_{10} = -5.34765 \times 10^{-23}$
$C_{12} = 1.17371 \times 10^{-26}$
$C_{14} = 5.83332 \times 10^{-31}$
$C_{16} = -4.24504 \times 10^{-35}$

49 TH SURFACE $\kappa = 0$
$C_4 = -6.57508 \times 10^{-8}$
$C_6 = 1.70210 \times 10^{-15}$
$C_8 = 1.16705 \times 10^{-16}$
$C_{10} = -1.37891 \times 10^{-20}$
$C_{12} = 1.36399 \times 10^{-25}$
$C_{14} = 4.47204 \times 10^{-29}$
$C_{16} = -2.07916 \times 10^{-33}$

51 TH SURFACE $\kappa = 0$
$C_4 = 6.23295 \times 10^{-8}$
$C_6 = 1.52020 \times 10^{-12}$
$C_8 = -8.46549 \times 10^{-17}$
$C_{10} = -3.01706 \times 10^{-21}$
$C_{12} = 1.27914 \times 10^{-25}$
$C_{14} = 1.10840 \times 10^{-29}$
$C_{16} = -5.40441 \times 10^{-34}$

52 TH SURFACE $\kappa = 0$
$C_4 = -8.73044 \times 10^{-10}$
$C_6 = 1.67829 \times 10^{-12}$
$C_8 = -4.16023 \times 10^{-17}$
$C_{10} = -1.45165 \times 10^{-21}$
$C_{12} = 6.52873 \times 10^{-26}$
$C_{14} = -1.08406 \times 10^{-31}$
$C_{16} = -1.55999 \times 10^{-35}$

54 TH SURFACE $\kappa = 0$
$C_4 = -9.04314 \times 10^{-9}$
$C_6 = -4.87981 \times 10^{-13}$
$C_8 = 2.45050 \times 10^{-18}$
$C_{10} = 3.21314 \times 10^{-22}$
$C_{12} = -3.05331 \times 10^{-26}$
$C_{14} = 6.40579 \times 10^{-31}$
$C_{16} = 8.75272 \times 10^{-37}$

56 TH SURFACE $\kappa = 0$
$C_4 = -3.94105 \times 10^{-9}$
$C_6 = -1.20866 \times 10^{-14}$
$C_8 = -6.30108 \times 10^{-18}$
$C_{10} = 1.68821 \times 10^{-23}$
$C_{12} = 7.03912 \times 10^{-27}$
$C_{14} = -3.97182 \times 10^{-32}$
$C_{16} = -3.89542 \times 10^{-36}$

59 TH SURFACE $\kappa = 0$
$C_4 = -1.59760 \times 10^{-8}$
$C_6 = 1.77542 \times 10^{-13}$
$C_8 = 1.18207 \times 10^{-17}$
$C_{10} = -1.87799 \times 10^{-22}$
$C_{12} = -4.71028 \times 10^{-27}$
$C_{14} = 5.18795 \times 10^{-32}$
$C_{16} = 1.07242 \times 10^{-36}$

TABLE (1)-continued

62 TH SURFACE $\kappa = 0$
$C_4 = -6.35509 \times 10^{-8}$     $C_6 = 5.79733 \times 10^{-12}$
$C_8 = -4.17234 \times 10^{-16}$    $C_{10} = 6.77275 \times 10^{-21}$
$C_{12} = 1.24641 \times 10^{-24}$  $C_{14} = -8.13388 \times 10^{-29}$
$C_{16} = 1.62686 \times 10^{-33}$

64 TH SURFACE $\kappa = 0$
$C_4 = 5.22825 \times 10^{-8}$      $C_6 = 4.10375 \times 10^{-12}$
$C_8 = 7.80501 \times 10^{-16}$     $C_{10} = -9.71606 \times 10^{-21}$
$C_{12} = -1.52600 \times 10^{-24}$ $C_{14} = 5.37297 \times 10^{-28}$
$C_{16} = 1.38623 \times 10^{-32}$

(VALUE CORRESPONDING TO CONDITIONS)

Nb = 2.1435
Eb = 121.90 mm
Sb = 132 mm
|Rb| = 76.52285 mm
Yi = 12.53 mm
(1)Nb · Eb/|Rb| = 3.415
(2)Nb · Sb/|Rb| = 3.697
(3)Yi/|Rb| = 0.164
(4)|M1| = 1.34
(5)|M12| = 1.32

Figure 5:
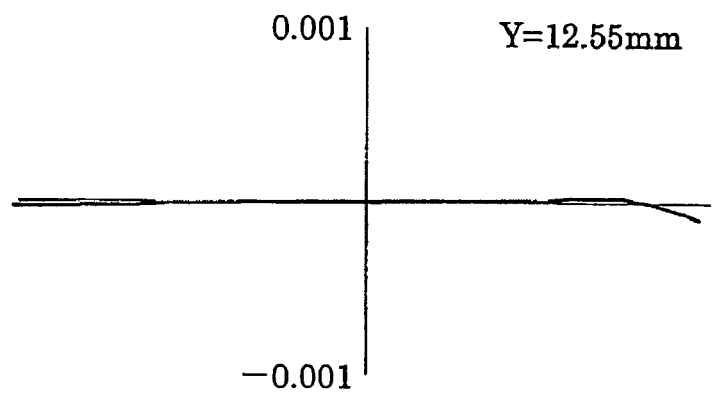
FIG. 5 is a drawing showing the transverse aberration in the projection optical system of the first example.
Figure 5:
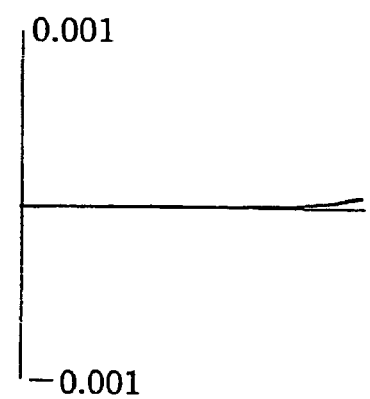
Figure 5:
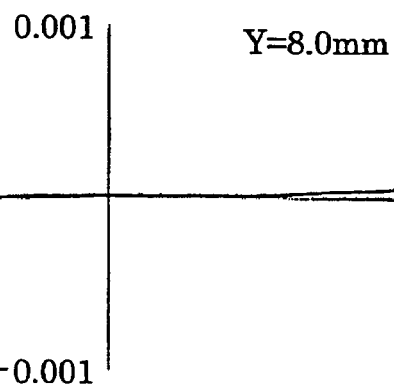
Figure 5:
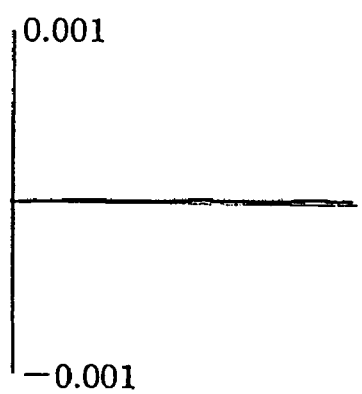
Figure 5:
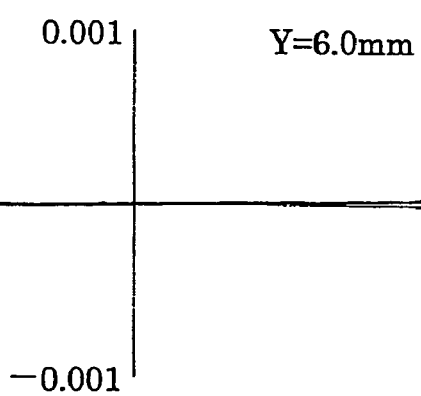
Figure 5:
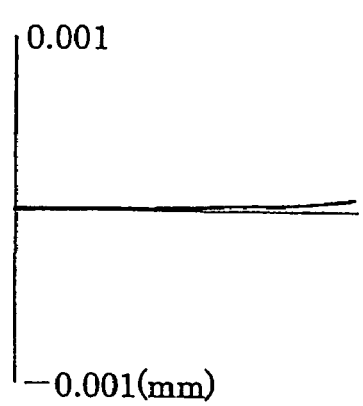

FIG. 5 is a drawing showing the transverse aberration in the projection optical system of the first example. In the aberration diagram, Y represents the image height. It is apparent from the aberration diagram of FIG. 5 that in the first example the aberration is well compensated for the ArF excimer laser light having the wavelength of 193.306 nm, while ensuring the very large image-side numerical aperture (NA=1.7) and the relatively large rectangular still exposure region ER (22 mm×3 mm).

SECOND EXAMPLE

Figure 6:
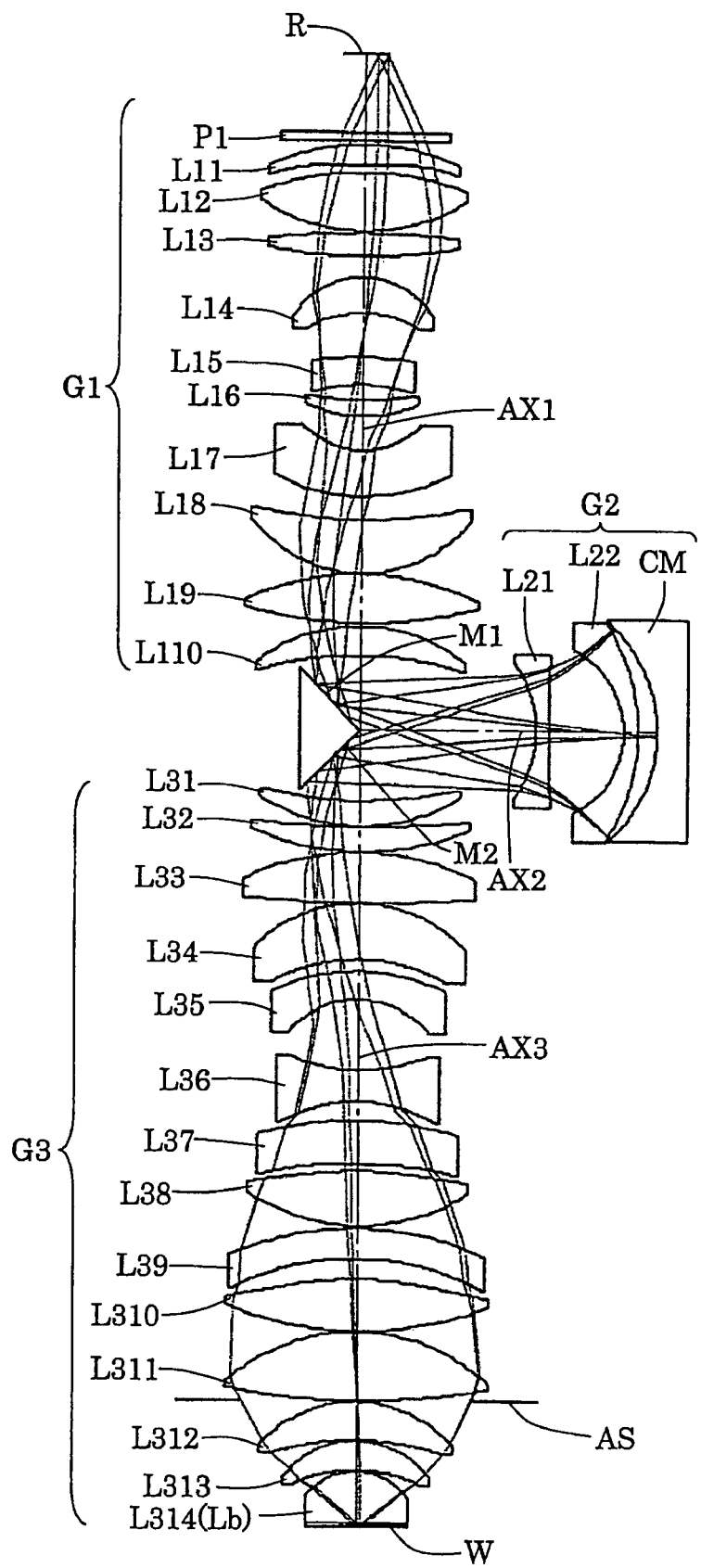
FIG. 6 is a drawing showing a lens configuration of a projection optical system according to the second example of the embodiment.

FIG. 6 is a drawing showing a lens configuration of the projection optical system according to the second example of the present embodiment. In the projection optical system PL of the second example the first imaging optical system G1 is composed of the following elements in the order named from the reticle side: plane-parallel plate P1, positive lens L11 whose aspherical surface is directed toward the wafer, biconvex lens L12, biconvex lens L13, positive meniscus lens L14 whose convex surface is directed toward the reticle, negative meniscus lens L15 whose convex surface is directed toward the reticle, positive meniscus lens L16 whose concave surface is directed toward the reticle, negative meniscus lens L17 whose concave surface of an aspherical shape is directed toward the reticle, positive meniscus lens L18 whose concave surface is directed toward the reticle, biconvex lens L19 whose convex surface of an aspherical shape is directed toward the reticle, and positive meniscus lens L110 whose concave surface of an aspherical shape is directed toward the wafer.

The second imaging optical system G2 is composed of the following elements in the order named from the entrance side of light along the outward traveling path of light: biconcave lens L21, negative meniscus lens L22 whose concave surface is directed toward the entrance side, and concave reflecting mirror CM whose concave surface is directed toward the entrance side. The third imaging optical system G3 is composed of the following elements in the order named from the reticle side (i.e. the entrance side of light): positive meniscus lens L31 whose concave surface is directed toward the reticle, positive meniscus lens L32 whose concave surface is directed toward the reticle, biconvex lens L33, positive meniscus lens L34 whose concave surface of an aspherical shape is directed toward the wafer, negative meniscus lens L35 whose convex surface is directed toward the reticle, biconcave lens L36 whose concave surface of an aspherical shape is directed toward the wafer, meniscus lens L37 whose concave surface of an aspherical shape is directed toward the wafer, biconvex lens L38 whose convex surface of an aspherical shape is directed toward the reticle, meniscus lens L39 whose concave surface of an aspherical shape is directed toward the wafer, biconvex lens L310 whose convex surface of an aspherical shape is directed toward the reticle, biconvex lens L311 whose convex surface of an aspherical shape is directed toward the wafer, aperture stop AS, positive meniscus lens L312 whose concave surface of an aspherical shape is directed toward the wafer, positive meniscus lens L313 whose concave surface of an aspherical shape is directed toward the wafer, and plano-convex lens L314 (boundary lens Lb) whose plane is directed toward the wafer.

In the second example, the optical path between the boundary lens Lb and the wafer W is filled with a high-index liquid Lm (not shown in FIG. 6) having the refractive index of 1.85 for the ArF excimer laser light (center wavelength λ=193.306 nm) being used light. This high-index liquid Lm applicable herein is, for example, a hydrocarbon type medium (liquid). The boundary lens Lb is made of Lutetium Aluminum Garnet crystal having the refractive index of 2.1435 for the center wavelength of the used light. The optically transparent members (plane-parallel plate P1, and lenses L11-L110, L21, L22, L31-L313) other than the boundary lens Lb are made of quartz having the refractive index of 1.5603261 for the center wavelength of the used light. Table (2) below presents values of specifications of the projection optical system PL according to the second example.

TABLE (2)

(PRINCIPAL SPECIFICATION)

λ = 193.306 nm
β = ¼
NA = 1.65
B = 14.77 mm
A = 4 mm
LX = 26 mm
LY = 3 mm

(SPECIFICATIONS OF OPTICAL MEMBERS)

| SURFACE NO> | r | d | n | OPTICAL MEMBER |
|---|---|---|---|---|
| | (RETICLE SURFACE) | 95.79241 | | |
| 1 | ∞ | 8.00000 | 1.5603261 | (P1) |
| 2 | ∞ | 4.94193 | | |
| 3 | 290.55007 | 24.20361 | 1.5603261 | (L11) |
| 4* | 10000.00000 | 9.07389 | | |
| 5 | 371.78850 | 72.04392 | 1.5603261 | (L12) |
| 6 | −232.84509 | 2.31444 | | |
| 7 | 1044.13988 | 27.92358 | 1.5603261 | (L13) |
| 8 | −676.06981 | 25.95898 | | |
| 9 | 102.96385 | 43.22321 | 1.5603261 | (L14) |
| 10 | 136.09207 | 53.76787 | | |
| 11 | 481.08238 | 34.00801 | 1.5603261 | (L15) |
| 12 | 199.11455 | 18.61258 | | |
| 13 | −392.25357 | 19.96633 | 1.5603261 | (L16) |
| 14 | −171.74967 | 42.30600 | | |
| 15* | −94.90547 | 54.84856 | 1.5603261 | (L17) |
| 16 | −244.24835 | 29.31466 | | |
| 17 | −565.24415 | 65.97920 | 1.5603261 | (L18) |
| 18 | −174.35572 | 1.00000 | | |

TABLE (2)-continued

| | | | | |
|---|---|---|---|---|
| 19* | 310.58794 | 60.37659 | 1.5603261 | (L19) |
| 20 | −557.17879 | 4.00000 | | |
| 21 | 213.99732 | 36.34032 | 1.5603261 | (L110) |
| 22* | 581.36155 | 89.00000 | | |
| 23 | ∞ | 217.11733 | | (M1) |
| 24 | −143.19064 | 15.00000 | 1.5603261 | (L21) |
| 25 | 1310.08704 | 92.14202 | | |
| 26 | −113.63092 | 18.00000 | 1.5603261 | (L22) |
| 27 | −246.37907 | 24.14746 | | |
| 28 | −178.32790 | −24.14746 | | (CM) |
| 29 | −246.37907 | −18.00000 | 1.5603261 | (L22) |
| 30 | −113.63092 | −92.14202 | | |
| 31 | 1310.08704 | −15.00000 | 1.5603261 | (L21) |
| 32 | −143.19064 | −217.11733 | | |
| 33 | ∞ | 89.00000 | | (M2) |
| 34 | −500.00000 | 31.55290 | 1.5603261 | (L31) |
| 35 | −231.66306 | 1.00000 | | |
| 36 | −1196.32597 | 30.18971 | 1.5603261 | (L32) |
| 37 | −349.91221 | 1.00000 | | |
| 38 | 330.38995 | 62.32681 | 1.5603261 | (L33) |
| 39 | −1986.88620 | 1.00000 | | |
| 40 | 183.22446 | 70.00000 | 1.5603261 | (L34) |
| 41* | 240.29220 | 14.22675 | | |
| 42 | 247.15019 | 34.96799 | 1.5603261 | (L35) |
| 43 | 113.96650 | 87.21052 | | |
| 44 | −214.05604 | 37.83220 | 1.5603261 | (L36) |
| 45* | 161.84896 | 23.93163 | | |
| 46 | 456.55365 | 52.80809 | 1.5603261 | (L37) |
| 47* | 974.56388 | 8.67428 | | |
| 48* | 512.42634 | 65.94644 | 1.5603261 | (L38) |
| 49 | −251.06433 | 3.80666 | | |
| 50 | 400.91135 | 36.47217 | 1.5603261 | (L39) |
| 51* | 340.57626 | 25.63765 | | |
| 52* | 454.89697 | 62.59357 | 1.5603261 | (L310) |
| 53 | −451.78211 | 1.00000 | | |
| 54 | 250.00000 | 83.00371 | 1.5603261 | (L311) |
| 55* | −1048.65772 | 0.00000 | | |
| 56 | ∞ | 1.00000 | | (AS) |
| 57 | 162.32518 | 47.07232 | 1.5603261 | (L312) |
| 58* | 307.13474 | 1.00000 | | |
| 59 | 114.68314 | 36.91436 | 1.5603261 | (L313) |
| 60* | 236.60239 | 1.00000 | | |
| 61 | 81.37948 | 62.83630 | 2.1435 | (L314:Lb) |
| 62 | ∞ | 3.00000 | 1.85 | (Lm) |
| | (WAFER SURFACE) | | | |

(ASPHRICAL DATA)

4 TH SURFACE $\kappa = 0$
$C_4 = 6.71925 \times 10^{-8}$      $C_6 = 2.86856 \times 10^{-14}$
$C_8 = -8.82744 \times 10^{-18}$     $C_{10} = 4.89166 \times 10^{-22}$
$C_{12} = -5.97756 \times 10^{-26}$  $C_{14} = 1.34238 \times 10^{-30}$
$C_{16} = 0$

15 TH SURFACE $\kappa = 0$
$C_4 = 9.45180 \times 10^{-8}$       $C_6 = 2.44998 \times 10^{-12}$
$C_8 = 2.92994 \times 10^{-16}$      $C_{10} = 1.10431 \times 10^{-20}$
$C_{12} = 1.13651 \times 10^{-24}$   $C_{14} = 1.09976 \times 10^{-28}$
$C_{16} = 1.86004 \times 10^{-32}$

19 TH SURFACE $\kappa = 0$
$C_4 = -8.28989 \times 10^{-9}$      $C_6 = 9.03916 \times 10^{-14}$
$C_8 = -5.93851 \times 10^{-18}$     $C_{10} = 1.18472 \times 10^{-22}$
$C_{12} = -1.35414 \times 10^{-27}$  $C_{14} = 7.33191 \times 10^{-33}$
$C_{16} = 0$

22 TH SURFACE $\kappa = 0$
$C_4 = 1.91838 \times 10^{-8}$       $C_6 = -1.52896 \times 10^{-13}$
$C_8 = 1.59594 \times 10^{-18}$      $C_{10} = -1.60899 \times 10^{-22}$
$C_{12} = 8.09048 \times 10^{-27}$   $C_{14} = -2.51040 \times 10^{-31}$
$C_{16} = 3.59781 \times 10^{-36}$

41 TH SURFACE $\kappa = 0$
$C_4 = 1.20458 \times 10^{-8}$       $C_6 = 1.81922 \times 10^{-13}$
$C_8 = 6.72758 \times 10^{-18}$      $C_{10} = 2.98254 \times 10^{-23}$
$C_{12} = 1.89454 \times 10^{-26}$   $C_{14} = -8.60137 \times 10^{-31}$
$C_{16} = 3.68712 \times 10^{-35}$

45 TH SURFACE $\kappa = 0$
$C_4 = -6.28424 \times 10^{-8}$      $C_6 = -5.01366 \times 10^{-14}$
$C_8 = -2.46211 \times 10^{-17}$     $C_{10} = -2.03486 \times 10^{-21}$
$C_{12} = -2.89192 \times 10^{-27}$  $C_{14} = -2.09348 \times 10^{-30}$
$C_{16} = -1.37193 \times 10^{-35}$

47 TH SURFACE $\kappa = 0$
$C_4 = 2.88475 \times 10^{-8}$       $C_6 = -2.93712 \times 10^{-14}$
$C_8 = -1.70266 \times 10^{-17}$     $C_{10} = -9.07403 \times 10^{-22}$
$C_{12} = 1.08624 \times 10^{-25}$   $C_{14} = -8.84102 \times 10^{-31}$
$C_{16} = -2.61000 \times 10^{-35}$

48 TH SURFACE $\kappa = 0$
$C_4 = -1.49171 \times 10^{-8}$      $C_6 = -3.63470 \times 10^{-14}$
$C_8 = 5.31328 \times 10^{-18}$      $C_{10} = -8.86009 \times 10^{-22}$
$C_{12} = 6.63958 \times 10^{-26}$   $C_{14} = -2.11767 \times 10^{-30}$
$C_{16} = 4.99164 \times 10^{-35}$

51 TH SURFACE $\kappa = 0$
$C_4 = -2.90283 \times 10^{-10}$     $C_6 = -8.37597 \times 10^{-14}$
$C_8 = 1.39712 \times 10^{-19}$      $C_{10} = 1.39880 \times 10^{-23}$
$C_{12} = 3.40888 \times 10^{-27}$   $C_{14} = -3.78634 \times 10^{-32}$
$C_{16} = 0$

52 TH SURFACE $\kappa = 0$
$C_4 = -1.17805 \times 10^{-8}$      $C_6 = -4.18409 \times 10^{-14}$
$C_8 = -3.11911 \times 10^{-18}$     $C_{10} = 1.64739 \times 10^{-22}$
$C_{12} = 4.49090 \times 10^{-27}$   $C_{14} = -1.61599 \times 10^{-31}$
$C_{16} = 2.11555 \times 10^{-36}$

55 TH SURFACE $\kappa = 0$
$C_4 = -1.08737 \times 10^{-8}$      $C_6 = 2.68918 \times 10^{-13}$
$C_8 = 5.14824 \times 10^{-18}$      $C_{10} = -3.68087 \times 10^{-22}$
$C_{12} = 8.07432 \times 10^{-27}$   $C_{14} = -7.81523 \times 10^{-32}$
$C_{16} = 2.33828 \times 10^{-37}$

58 TH SURFACE $\kappa = 0$
$C_4 = -3.62401 \times 10^{-8}$      $C_6 = 3.46327 \times 10^{-12}$
$C_8 = -3.40831 \times 10^{-16}$     $C_{10} = 1.70996 \times 10^{-20}$
$C_{12} = 1.91165 \times 10^{-25}$   $C_{14} = -4.44785 \times 10^{-29}$
$C_{16} = 1.26068 \times 10^{-33}$

60 TH SURFACE $\kappa = 0$
$C_4 = 3.42495 \times 10^{-8}$       $C_6 = 7.87959 \times 10^{-12}$
$C_8 = 2.25683 \times 10^{-16}$      $C_{10} = -3.92150 \times 10^{-20}$
$C_{12} = 2.37827 \times 10^{-24}$   $C_{14} = 2.96227 \times 10^{-28}$
$C_{16} = -3.61232 \times 10^{-32}$ (VALUE CORRESPONDING TO CONDITIONS)

Nb = 2.1435
Eb = 123.91 mm
Sb = 126 mm
|Rb| = 81.37948 mm
Yi = 14.77 mm
(1) Nb · Eb/|Rb| = 3.264
(2) Nb · Sb/|Rb| = 3.319
(3) Yi/|Rb| = 0.181
(4) |M1| = 1.42
(5) |M12| = 1.43

Figure 7:
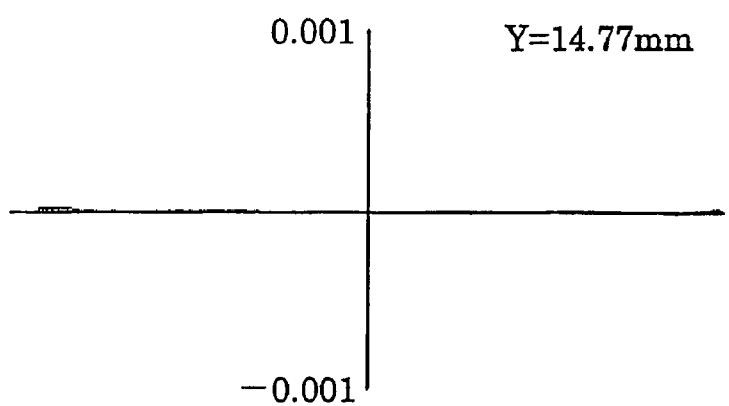
FIG. 7 is a drawing showing the transverse aberration in the projection optical system of the second example.
Figure 7:
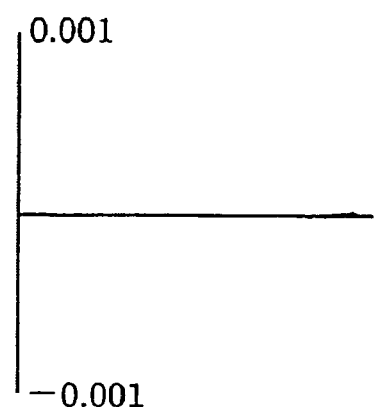
Figure 7:
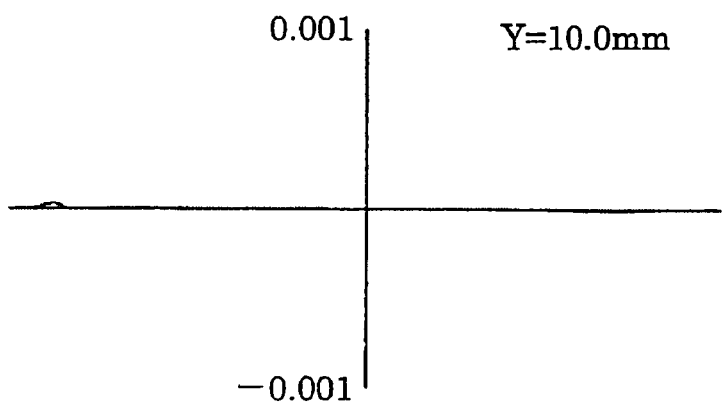
Figure 7:
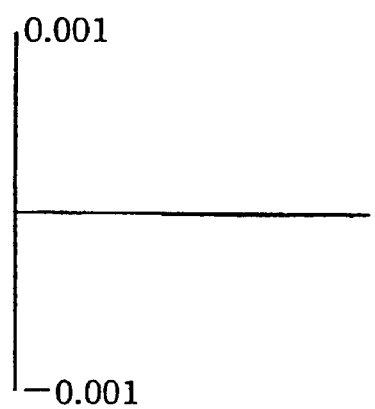
Figure 7:
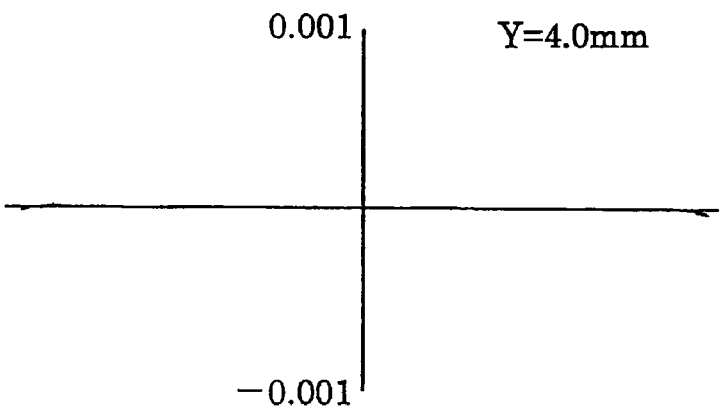
Figure 7:
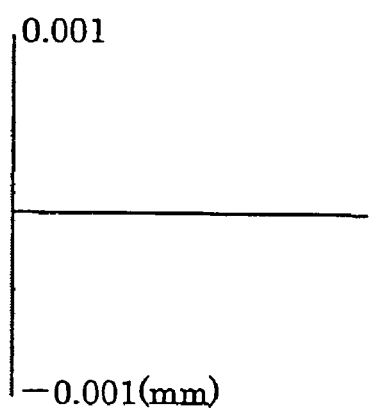

FIG. 7 is a drawing showing the transverse aberration in the projection optical system of the second example. In the aberration diagram, Y represents the image height. It is apparent from the aberration diagram of FIG. 7 that in the second example, as in the first example, the aberration is also well compensated for the ArF excimer laser light having the wavelength of 193.306 nm, while ensuring the very large image-side numerical aperture (NA=1.65) and the relatively large rectangular still exposure region ER (26 mm×3 mm).

THIRD EXAMPLE

Figure 8:
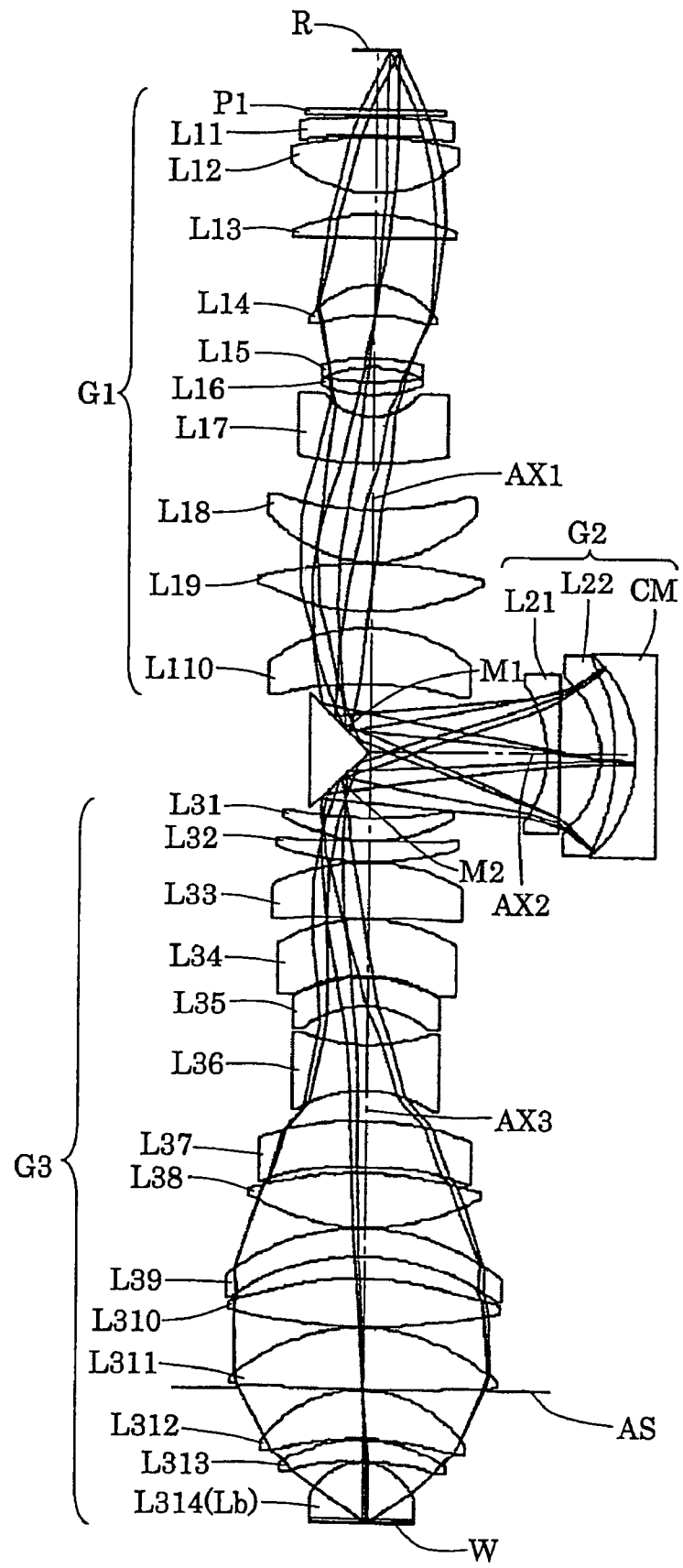
FIG. 8 is a drawing showing a lens configuration of a projection optical system according to the third example of the embodiment.

FIG. 8 is a drawing showing a lens configuration of the projection optical system according to the third example of the present embodiment. In the projection optical system PL of the third example the first imaging optical system G1 is composed of the following elements in the order named from the reticle side: plane-parallel plate P1, lens L11 whose concave surface of an aspherical shape is directed toward the wafer, biconvex lens L12, positive meniscus lens L13 whose convex surface is directed toward the reticle, positive meniscus lens L14 whose convex surface is directed toward the reticle, negative meniscus lens L15 whose convex surface is directed toward the reticle, positive meniscus lens L16 whose concave surface is directed toward the reticle, negative meniscus lens L17 whose concave surface of an aspherical shape is directed toward the reticle, positive meniscus lens L18 whose concave surface is directed toward the reticle, biconvex lens L19 whose convex surface of an aspherical shape is directed toward the reticle, and positive meniscus lens L110 whose concave surface of an aspherical shape is directed toward the wafer.

The second imaging optical system G2 is composed of the following elements in the order named from the entrance side of light along the outward traveling path of light: biconcave lens L21, negative meniscus lens L22 whose concave surface is directed toward the entrance side, and concave reflecting mirror CM whose concave surface is directed toward the entrance side. The third imaging optical system G3 is composed of the following elements in the order named from the reticle side (i.e. the entrance side of light): positive meniscus lens L31 whose concave surface is directed toward the reticle, positive meniscus lens L32 whose concave surface is directed toward the reticle, positive meniscus lens L33 whose convex surface is directed toward the reticle, meniscus lens L34 whose concave surface of an aspherical shape is directed toward the wafer, negative meniscus lens L35 whose convex surface is directed toward the reticle, biconcave lens L36 whose concave surface of an aspherical shape is directed toward the wafer, meniscus lens L37 whose concave surface of an aspherical shape is directed toward the wafer, biconvex lens L38 whose convex surface of an aspherical shape is directed toward the reticle, meniscus lens L39 whose concave surface of an aspherical shape is directed toward the wafer, biconvex lens L310 whose convex surface of an aspherical shape is directed toward the reticle, biconvex lens L311 whose convex surface of an aspherical shape is directed toward the wafer, aperture stop AS, positive meniscus lens L312 whose concave surface of an aspherical shape is directed toward the wafer, positive meniscus lens L313 whose concave surface of an aspherical shape is directed toward the wafer, and plano-convex lens L314 (boundary lens Lb) whose plane is directed toward the wafer.

In the third example, the optical path between the boundary lens Lb and the wafer W is filled with a high-index liquid Lm (not shown in FIG. 8) having the refractive index of 1.90 for the ArF excimer laser light (center wavelength λ=193.306 nm) being used light. This high-index liquid Lm applicable herein is, for example, a hydrocarbon type medium (liquid). The boundary lens Lb is made of Lutetium Aluminum Garnet crystal having the refractive index of 2.1435 for the center wavelength of the used light. The optically transparent members (plane-parallel plate P1, and lenses L11-L110, L21, L22, L31-L313) other than the boundary lens Lb are made of quartz having the refractive index of 1.5603261 for the center wavelength of the used light. Table (3) below presents values of specifications of the projection optical system PL according to the third example.

TABLE (3)

(PRINCIPAL SPECIFICATION)

λ = 193.306 nm
β = ¼
NA = 1.75
B = 12.62 mm
A = 4 mm
LX = 21 mm
LY = 3 mm (SPECIFICATIONS OF OPTICAL MEMBERS

| SURFACE NO. | r | d | n | OPTICAL MEMBER |
|---|---|---|---|---|
|  | (RETICLE SURFACE) | 70.36075 |  |  |
| 1 | ∞ | 8.00000 | 1.5603261 | (P1) |
| 2 | ∞ | 2.51640 |  |  |
| 3 | 1108.40074 | 23.90795 | 1.5603261 | (L11) |
| 4* | 10000.00000 | 1.32841 |  |  |
| 5 | 517.85614 | 66.83341 | 1.5603261 | (L12) |
| 6 | −162.97645 | 24.96049 |  |  |
| 7 | 277.54372 | 28.92381 | 1.5603261 | (L13) |
| 8 | 3582.96906 | 57.84392 |  |  |
| 9 | 101.18648 | 35.52040 | 1.5603261 | (L14) |
| 10 | 228.17069 | 53.32576 |  |  |
| 11 | 271.69879 | 10.84850 | 1.5603261 | (L15) |
| 12 | 163.76221 | 17.69223 |  |  |
| 13 | −410.79344 | 16.68405 | 1.5603261 | (L16) |
| 14 | −191.87487 | 24.97191 |  |  |
| 15* | −80.68030 | 58.66268 | 1.5603261 | (L17) |
| 16 | −413.44354 | 55.93521 |  |  |
| 17 | −432.13330 | 63.62216 | 1.5603261 | (L18) |
| 18 | −172.35310 | 1.74388 |  |  |
| 19* | 477.03096 | 58.85047 | 1.5603261 | (L19) |
| 20 | −322.33899 | 20.96321 |  |  |
| 21 | 204.08323 | 69.95373 | 1.5603261 | (L110) |
| 22* | 524.71403 | 82.50000 |  |  |
| 23 | ∞ | 221.13365 |  | (M1) |
| 24 | −140.51909 | 15.00000 | 1.5603261 | (L21) |
| 25 | 75205.55639 | 49.97395 |  |  |
| 26 | −125.74019 | 18.00000 | 1.5603261 | (L22) |
| 27 | −262.38105 | 26.57861 |  |  |
| 28 | −167.04155 | −26.57861 |  | (CM) |
| 29 | −262.38105 | −18.00000 | 1.5603261 | (L22) |
| 30 | −125.74019 | −49.97395 |  |  |
| 31 | 75205.55639 | −15.00000 | 1.5603261 | (L21) |
| 32 | −140.51909 | −221.13365 |  |  |
| 33 | ∞ | 82.50000 |  | (M2) |
| 34 | −550.00000 | 27.54534 | 1.5603261 | (L31) |
| 35 | −220.48078 | 1.00000 |  |  |
| 36 | −1825.56596 | 25.38945 | 1.5603261 | (L32) |
| 37 | −362.87141 | 1.00000 |  |  |
| 38 | 257.47073 | 69.41067 | 1.5603261 | (L33) |
| 39 | 6265.27755 | 1.00000 |  |  |
| 40 | 214.44567 | 70.00000 | 1.5603261 | (L34) |
| 41* | 199.92803 | 1.78681 |  |  |
| 42 | 193.32269 | 35.09037 | 1.5603261 | (L35) |
| 43 | 121.46742 | 46.70531 |  |  |
| 44 | −245.99815 | 56.40107 | 1.5603261 | (L36) |
| 45* | 150.30813 | 37.86019 |  |  |
| 46 | 399.54165 | 55.17998 | 1.5603261 | (L37) |
| 47* | 560.60096 | 8.67428 |  |  |
| 48* | 472.29963 | 65.00000 | 1.5603261 | (L38) |
| 49 | −292.49135 | 1.02162 |  |  |
| 50 | 272.62149 | 35.00000 | 1.5603261 | (L39) |

TABLE (3)-continued

| | | | | |
|---|---|---|---|---|
| 51* | 291.62171 | 27.75671 | | |
| 52* | 404.10571 | 58.98600 | 1.5603261 | (L310) |
| 53 | −723.18420 | 1.07854 | | |
| 54 | 250.00000 | 75.56909 | 1.5603261 | (L311) |
| 55* | −5000.00000 | 0.00000 | | |
| 56 | ∞ | 1.00000 | | (AS) |
| 57 | 161.82814 | 57.16338 | 1.5603261 | (L312) |
| 58* | 332.19280 | 1.00000 | | |
| 59 | 188.68664 | 27.26352 | 1.5603261 | (L313) |
| 60* | 540.59898 | 1.00000 | | |
| 61 | 72.70966 | 69.63109 | 2.1435 | (L314:Lb) |
| 62 | ∞ | 3.00000 | 1.9 | (Lm) |
| | (WAFER SURFACE) | | | |

(ASPHERICAL DATA)

4TH SURFACE $\kappa = 0$
$C_4 = 6.39886 \times 10^{-8}$    $C_6 = -7.48102 \times 10^{-14}$
$C_8 = -6.46877 \times 10^{-17}$   $C_{10} = 5.58034 \times 10^{-22}$
$C_{12} = 2.78133 \times 10^{-26}$  $C_{14} = 1.26658 \times 10^{-31}$
$C_{16} = 0$

15TH SURFACE $\kappa = 0$
$C_4 = 4.56011 \times 10^{-8}$    $C_6 = -3.77075 \times 10^{-12}$
$C_8 = -1.07997 \times 10^{-15}$   $C_{10} = 1.01525 \times 10^{-19}$
$C_{12} = -1.62556 \times 10^{-22}$ $C_{14} = 3.61730 \times 10^{-26}$
$C_{16} = -6.07734 \times 10^{-30}$

19TH SURFACE $\kappa = 0$
$C_4 = -7.36665 \times 10^{-9}$   $C_6 = 4.90016 \times 10^{-14}$
$C_8 = -1.67948 \times 10^{-18}$   $C_{10} = 2.34580 \times 10^{-23}$
$C_{12} = -1.43231 \times 10^{-29}$ $C_{14} = -1.90420 \times 10^{-33}$
$C_{16} = 0$

22 TH SURFACE $\kappa = 0$
$C_4 = 1.45370 \times 10^{-8}$    $C_6 = -2.17268 \times 10^{-15}$
$C_8 = 4.81467 \times 10^{-19}$   $C_{10} = -9.54273 \times 10^{-23}$
$C_{12} = 8.35107 \times 10^{-27}$  $C_{14} = -4.41816 \times 10^{-31}$
$C_{16} = 1.01022 \times 10^{-35}$

41 TH SURFACE $\kappa = 0$
$C_4 = 1.59074 \times 10^{-8}$    $C_6 = -5.09704 \times 10^{-13}$
$C_8 = 2.26963 \times 10^{-17}$    $C_{10} = -1.08135 \times 10^{-21}$
$C_{12} = 2.37868 \times 10^{-26}$  $C_{14} = -6.57600 \times 10^{-32}$
$C_{16} = 2.65292 \times 10^{-34}$

45 TH SURFACE $\kappa = 0$
$C_4 = -5.74469 \times 10^{-8}$   $C_6 = -6.16058 \times 10^{-14}$
$C_8 = -5.83165 \times 10^{-7}$    $C_{10} = -9.93868 \times 10^{-22}$
$C_{12} = -1.32152 \times 10^{-25}$ $C_{14} = -1.34164 \times 10^{-30}$
$C_{16} = 1.11879 \times 10^{-34}$

47 TH SURFACE $\kappa = 0$
$C_4 = 2.95716 \times 10^{-8}$    $C_6 = -3.97202 \times 10^{-13}$
$C_8 = -1.94973 \times 10^{-17}$   $C_{10} = -7.81949 \times 10^{-22}$
$C_{12} = 1.19455 \times 10^{-25}$  $C_{14} = -4.22525 \times 10^{-30}$
$C_{16} = 5.21723 \times 10^{-35}$

48 TH SURFACE $\kappa = 0$
$C_4 = -7.21200 \times 10^{-9}$   $C_6 = 1.58717 \times 10^{-13}$
$C_8 = -1.45230 \times 10^{-17}$   $C_{10} = -3.55639 \times 10^{-22}$
$C_{12} = 5.06184 \times 10^{-26}$  $C_{14} = -1.68510 \times 10^{-30}$
$C_{16} = 2.44919 \times 10^{-35}$

51 TH SURFACE $\kappa = 0$
$C_4 = -4.46098 \times 10^{-10}$  $C_6 = 2.06519 \times 10^{-13}$
$C_8 = -5.79631 \times 10^{-18}$   $C_{10} = 3.94661 \times 10^{-23}$
$C_{12} = -2.16218 \times 10^{-27}$ $C_{14} = 9.27980 \times 10^{-32}$
$C_{16} = 0$

52 TH SURFACE $\kappa = 0$
$C_4 = -6.58007 \times 10^{-9}$   $C_6 = -1.41046 \times 10^{-13}$
$C_8 = -2.12956 \times 10^{-18}$   $C_{10} = 2.14211 \times 10^{-22}$
$C_{12} = -4.68468 \times 10^{-27}$ $C_{14} = -9.47271 \times 10^{-33}$
$C_{16} = 1.81282 \times 10^{-36}$

55 TH SURFACE $\kappa = 0$
$C_4 = -6.08085 \times 10^{-9}$   $C_6 = 1.99279 \times 10^{-13}$
$C_8 = -2.50504 \times 10^{-19}$   $C_{10} = -2.45747 \times 10^{-22}$
$C_{12} = 1.31708 \times 10^{-26}$  $C_{14} = -2.75841 \times 10^{-31}$
$C_{16} = 1.54966 \times 10^{-36}$

58 TH SURFACE $\kappa = 0$
$C_4 = -5.04064 \times 10^{-8}$   $C_6 = 4.34528 \times 10^{-12}$
$C_8 = -3.73648 \times 10^{-16}$    $C_{10} = 1.52439 \times 10^{-20}$
$C_{12} = 2.29150 \times 10^{-25}$  $C_{14} = -3.89266 \times 10^{-29}$
$C_{16} = 9.84214 \times 10^{-34}$

60 TH SURFACE $\kappa = 0$
$C_4 = 5.72458 \times 10^{-8}$    $C_6 = -5.18053 \times 10^{-14}$
$C_8 = 5.43071 \times 10^{-16}$    $C_{10} = -5.22385 \times 10^{-20}$
$C_{12} = 4.13911 \times 10^{-24}$  $C_{14} = -2.04994 \times 10^{-28}$
$C_{16} = 7.36502 \times 10^{-33}$ (VALUE CORRESPONDING TO CONDITIONS)

Nb = 2.1435
Eb = 128.10 mm
Sb = 138 mm
|Rb| = 72.70966 mm
Yi = 12.62 mm
(1) Nb · Eb/|Rb| = 3.776
(2) Nb · Sb/|Rb| = 4.068
(3) Yi/|Rb| = 0.174
(4) |M1| = 1.41
(5) |M12| = 1.40

Figure 9:
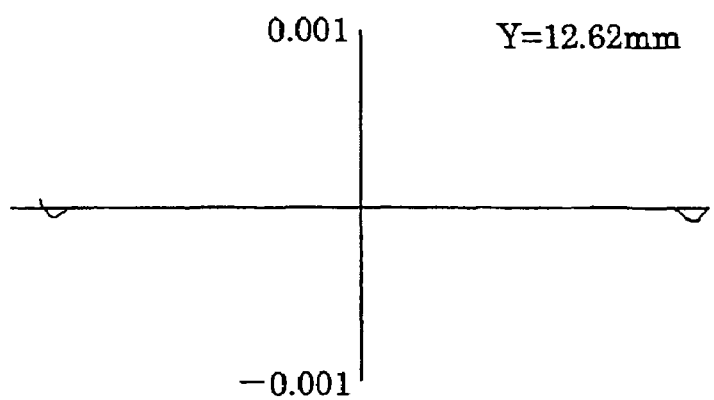
FIG. 9 is a drawing showing the transverse aberration in the projection optical system of the third example.
Figure 9:
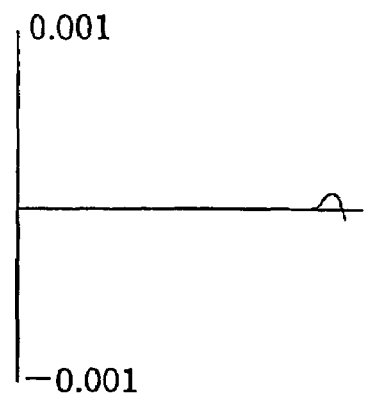
Figure 9:
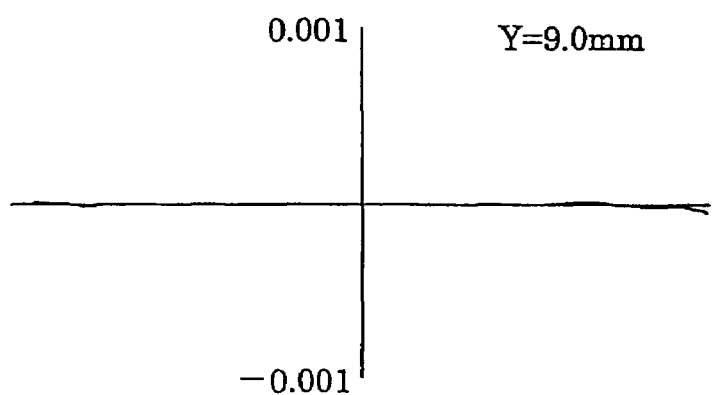
Figure 9:
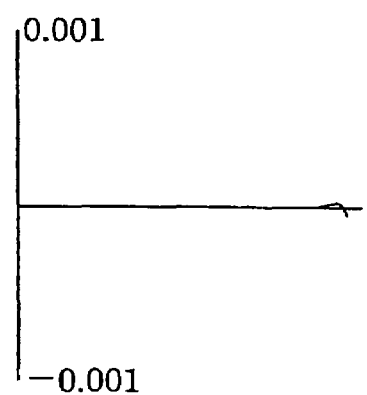
Figure 9:
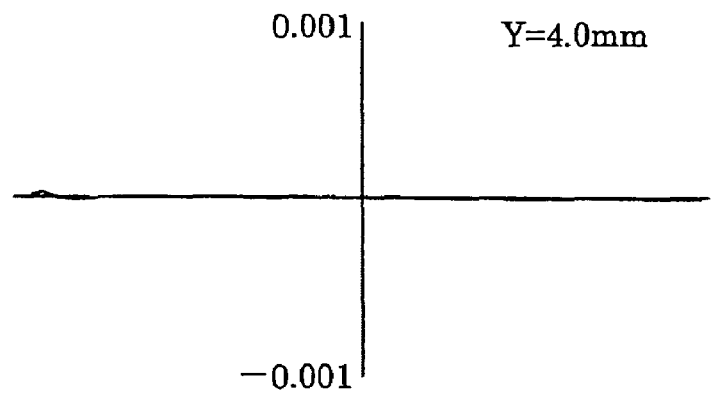
Figure 9:
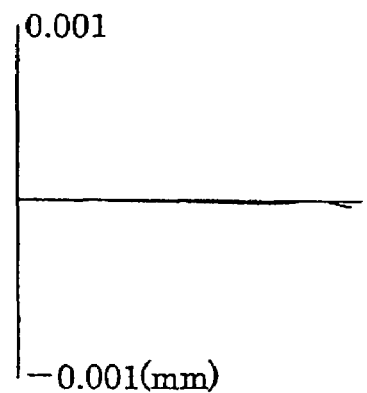

FIG. 9 is a drawing showing the transverse aberration in the projection optical system of the third example. In the aberration diagram, Y represents the image height. It is apparent from the aberration diagram of FIG. 9 that in the third example, as in the first example and the second example, the aberration is also well compensated for the ArF excimer laser light having the wavelength of 193.306 nm, while ensuring the very large image-side numerical aperture (NA=1.75) and the relatively large rectangular still exposure region ER (21 mm×3 mm).

In the projection optical system PL of each example, as described above, the optical path between the projection optical system and the image plane is filled with the high-index liquid Lm having the refractive index of 1.8-1.9 and the boundary lens Lb satisfies Conditions (1) and (2); therefore, the projection optical system PL ensures the large image-side numerical aperture of 1.65-1.75 while avoiding increase in the size of the optical system and achieving good compensation for aberration in the image plane. Specifically, in each of the above-described examples, the high image-side numerical aperture of 1.65-1.75 is ensured for the ArF excimer laser light of the center wavelength of 193.306 nm and the still exposure region ER in the rectangular shape of 21-26 mm×3 mm can be ensured; therefore, scanning exposure of the circuit pattern can be implemented in a high resolution, for example, in the rectangular exposure region of 21-26 mm×33 mm.

In each of the foregoing examples, the liquid Lm used is the high-index liquid having the refractive index of 1.8-1.9 for the center wavelength of the used light. In general, available high-index liquids having the refractive index larger than 1.5 include, for example, HIF-001 (the refractive index of 1.64 for ArF excimer laser light) available from JSR Co., Ltd., IF131 (the refractive index of 1.642 for ArF excimer laser light) and IF132 (the refractive index of 1.644 for ArF excimer laser light) available from E. I. du Pont de Nemours and Company, and so on. Other examples of available high-index liquids include, for example, Delphi (a compound based on a cyclic hydrocarbon skeleton, having the refractive index of 1.63 for ArF excimer laser light) available from Mitsui Chemicals, Inc., IF175 (the refractive index of 1.664 for ArF excimer laser light) available from E. I. du Pont de Nemours and Company, and so on.

In each of the foregoing examples, the boundary optical element used has a refractive index larger than 2.0 for the center wavelength of the used light. It is possible to obtain the boundary optical element without making the radius of curvature of the surface on the first plane side extremely smaller, by applying such a material with a high refractive index to the boundary optical element.

Figure 10:
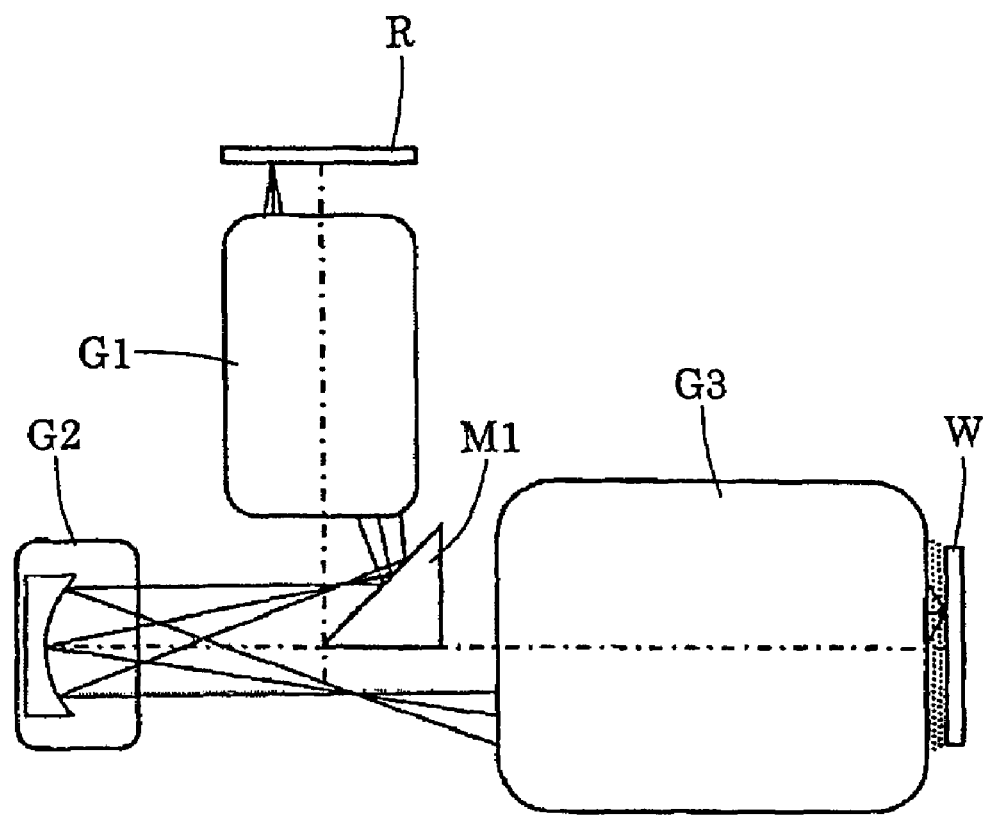
FIG. 10 is a drawing schematically showing a configuration of a projection optical system according to the first modification example.
Figure 11:
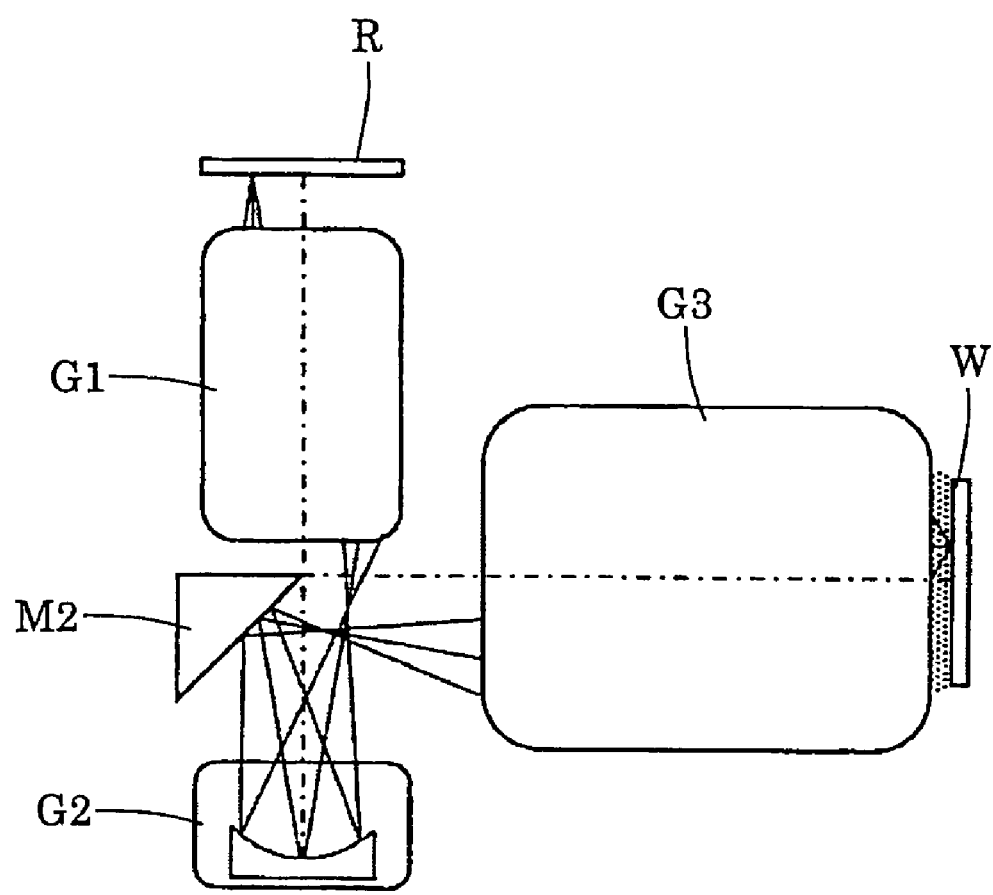
FIG. 11 is a drawing schematically showing a configuration of a projection optical system according to the second modification example.

In each of the aforementioned examples, the folding mirrors (M1, M2) are disposed in the optical path from the first imaging optical system G1 to the second imaging optical system G2 and in the optical path from the second imaging optical system G2 to the third imaging optical system G3 in the thrice imaging type catadioptric optical system. However, without having to be limited to this, an embodiment of the present invention is also applicable similarly to a catadioptric imaging optical system in which the folding mirror M1 is disposed only in the optical path between the first imaging optical system G1 and the second imaging optical system G2, for example, as shown in a modification example of FIG. 10. In this case, the reticle R and the wafer W can be arranged in parallel with each other by locating another folding mirror in the first imaging optical system G1 or in the third imaging optical system G3. Furthermore, an embodiment of the present invention is also applicable similarly to a catadioptric imaging optical system in which the folding mirror M2 is disposed only in the optical path between the second imaging optical system G2 and the third imaging optical system G3, for example, as shown in a modification example of FIG. 11. In this case, the reticle R and the wafer W can also be arranged in parallel with each other by locating another folding mirror in the first imaging optical system G1 or in the third imaging optical system G3.

Figure 12:
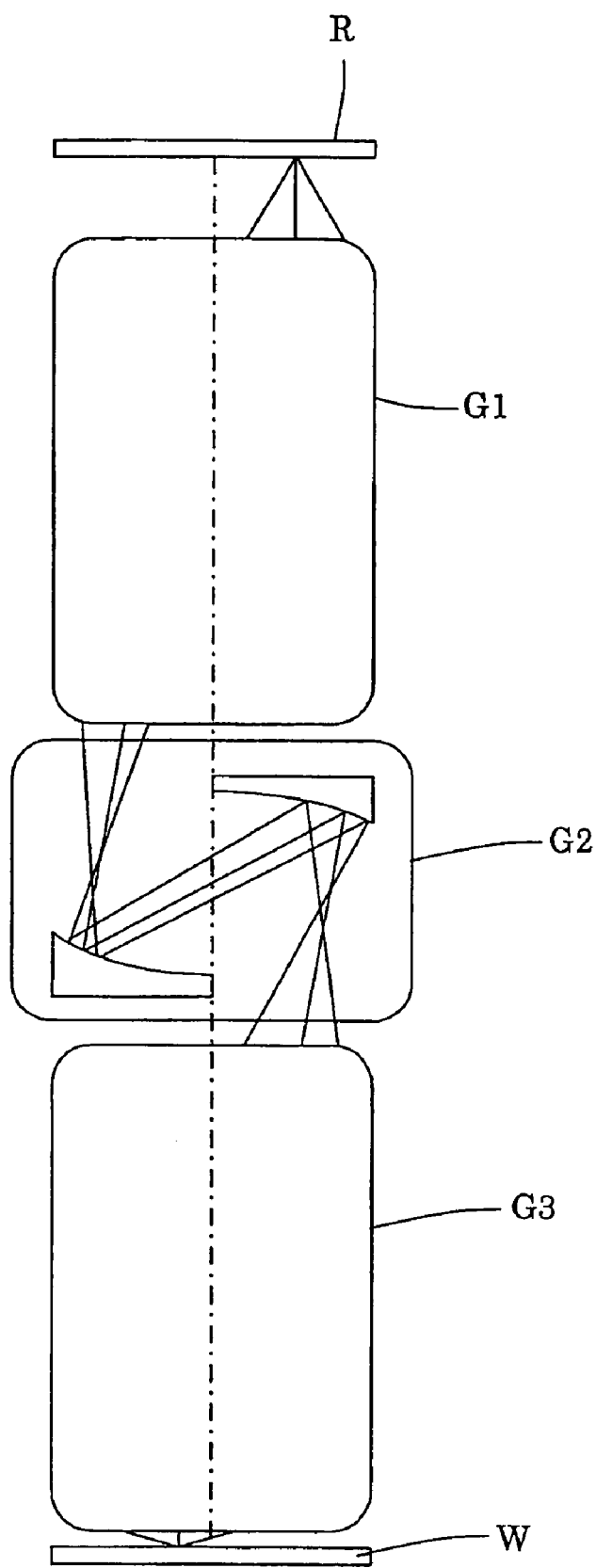
FIG. 12 is a drawing schematically showing a configuration of a projection optical system according to the third modification example.
Figure 13:
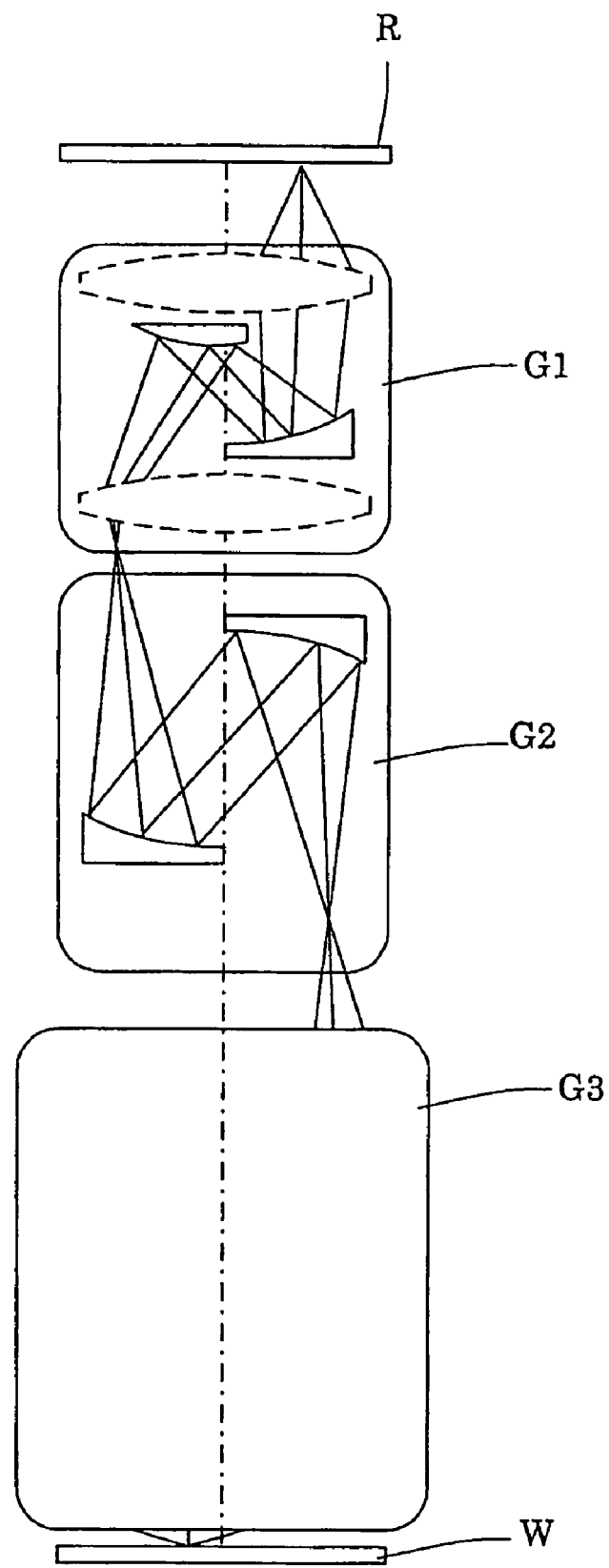
FIG. 13 is a drawing schematically showing a configuration of a projection optical system according to the fourth modification example.

In each of the above-described examples and each of the modification examples, at least one folding mirror is located between the imaging optical systems in the thrice imaging type catadioptric imaging optical system. However, without having to be limited to this, an embodiment of the present invention is also applicable similarly to a coaxial catadioptric imaging optical system comprising the first imaging optical system G1 of the dioptric type, the second imaging optical system G2 of a reflecting type or a catadioptric type, and the third imaging optical system G3 of the dioptric type, for example, as shown in a modification example of FIG. 12. Furthermore, an embodiment of the present invention is also applicable similarly to a coaxial catadioptric imaging optical system comprising the first imaging optical system G1 of the catadioptric type, the second imaging optical system G2 of the reflecting type or the catadioptric type, and the third imaging optical system G3 of the dioptric type, for example, as shown in a modification example of FIG. 13. The present invention is also applicable similarly to a single imaging type dioptric optical system.

Incidentally, the aforementioned embodiment can employ a variable pattern forming device (a viriable pattern generator) for forming a predetermined pattern on the basis of predetermined electronic data, instead of the mask (reticle). When such a pattern forming device is used, influence on synchronization accuracy can be minimized even if the pattern surface is vertically arranged. The pattern forming device to be used can be, for example, a DMD (Digital Micromirror Device) including a plurality of reflective elements driven based on predetermined electronic data. The exposure apparatus using the DMD are disclosed, for example, in Japanese Patent Applications Laid-Open No. 8-313842 and Laid-Open No. 2004-304135. Besides the non-emission type reflective spatial light modulators such as the DMD, it is also possible to use a transmissive spatial light modulator or a self-emission type image display device. The pattern forming device may use when the pattern surface is horizontally arranged.

The illumination optical apparatus and exposure apparatus according to the foregoing embodiment are fabricated by assembling various subsystems including the components as described in the scope of claims of the present application so as to maintain predetermined mechanical accuracy, electrical accuracy, and optical accuracy. For ensuring these various accuracies, the following adjustments are carried out before and after assembly: adjustment for achievement of optical accuracy for various optical systems, adjustment for achievement of mechanical accuracy for various mechanical systems, and adjustment for achievement of electrical accuracy for various electric systems. The assembly block of the exposure apparatus from the various subsystems includes mechanical connections, wiring connections of electric circuits, piping connections of pneumatic circuits, etc. between the various subsystems. It is needless to mention that there are assembly blocks of the individual subsystems, prior to the assembly block of the exposure apparatus from the various subsystems. After completion of the assembly block of the exposure apparatus from the various subsystems, comprehensive adjustment is carried out to ensure various accuracies as a whole of the exposure apparatus. The fabrication of the exposure apparatus may be carried out in a clean room in which the temperature, cleanliness, etc. are controlled.

The exposure apparatus of the foregoing embodiment can be used to fabricate micro devices (semiconductor devices, image pickup devices, liquid-crystal display devices, thin-film magnetic heads, etc.) by illuminating a reticle (mask) by the illumination apparatus (illumination block) and projecting a pattern to be transferred, formed in the mask, onto a photosensitive substrate through the projection optical system to effect exposure thereof (exposure block). An example of a technique of fabricating semiconductor devices as micro devices by forming a predetermined circuit pattern in the wafer or the like as a photosensitive substrate by means of the exposure apparatus of the present embodiment will be described below with reference to the flowchart of FIG. 14.

Figure 14:
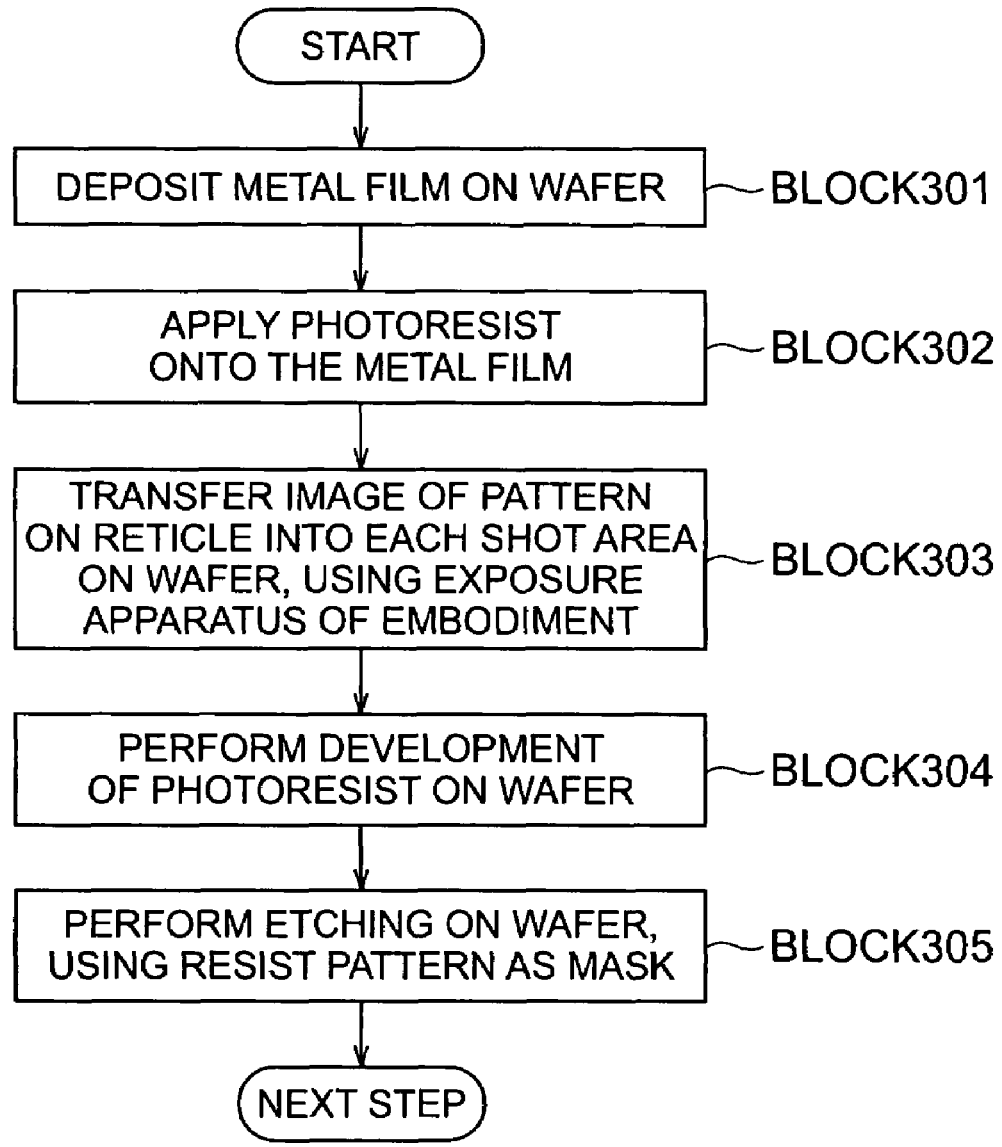
FIG. 14 is a flowchart of a technique of fabricating semiconductor devices as micro devices.

The first block 301 in FIG. 14 is to deposit a metal film on each wafer in one lot. The next block 302 is to apply a photoresist onto the metal film on each wafer in the lot. The subsequent block 303 is to sequentially transfer an image of a pattern on the mask into each shot area on each wafer in the lot through the projection optical system, using the exposure apparatus of the foregoing embodiment. The subsequent block 304 is to perform development of the photoresist on each wafer in the lot and the subsequent block 305 is to perform etching on each wafer in the lot, using the resist pattern as a mask, and thereby to form a circuit pattern corresponding to the pattern on the mask, in each shot area on each wafer.

Subsequent blocks include formation of circuit patterns in upper layers, and others, thereby fabricating devices such as semiconductor devices. The above-described semiconductor device fabrication method permits us to obtain semiconductor devices with extremely fine circuit patterns at high throughput. The blocks 301 to 305 were arranged to perform the blocks of depositing the metal on the wafer, applying the resist onto the metal film, and performing the exposure, development, and etching, but it is needless to mention that, prior to these blocks, the method may include a process of first forming an oxide film of silicon on the wafer, then applying a resist onto the oxide film of silicon, and performing each of blocks such as exposure, development, and etching.

Figure 15:
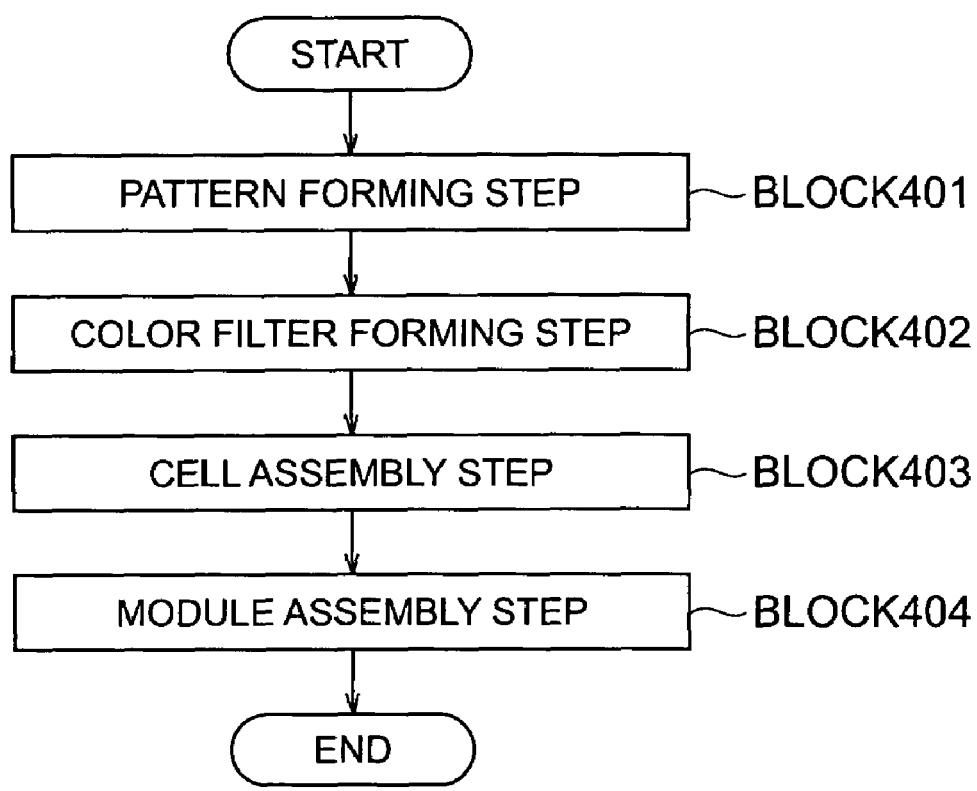
FIG. 15 is a flowchart of a technique of fabricating a liquid-crystal display device as a micro device.

The exposure apparatus of the present embodiment can also be used to fabricate a liquid-crystal display device as a micro device by forming predetermined patterns (circuit pattern, electrode pattern, etc.) on plates (glass substrates). An example of a technique in this case will be described with reference to the flowchart of FIG. 15. In FIG. 15, a pattern forming block 401 is to execute a so-called photolithography block to transfer a pattern of a mask onto a photosensitive substrate (glass substrate coated with a resist, or the like), using the exposure apparatus of the present embodiment. This photolithography block results in forming the predetermined pattern including a number of electrodes and others on the photosensitive substrate. Thereafter, the exposed substrate is subjected to each of blocks such as development, etching, and resist removal, whereby a predetermined pattern is formed on the substrate. Thereafter, the process shifts to the next color filter forming block 402.

The next color filter forming block 402 is to form a color filter in which a number of sets of three dots corresponding to R (Red), G (Green), and B (Blue) are arrayed in a matrix pattern, or in which sets of three stripe filters of R, G, and B are arrayed as a plurality of lines arranged in the horizontal scan line direction. After completion of the color filter forming block 402, a cell assembling block 403 is carried out. The cell assembling block 403 is to assemble a liquid crystal panel (liquid crystal cell), using the substrate with the predetermined pattern obtained in the pattern forming block 401, the color filter obtained in the color filter forming block 402, and so on.

In the cell assembly block 403, for example, a liquid crystal is poured into between the substrate with the predetermined pattern obtained in the pattern forming block 401 and the color filter obtained in the color filter forming block 402, to fabricate a liquid crystal panel (liquid crystal cell). The subsequent module assembly block 404 is to install each of components such as an electric circuit, a backlight, etc. for display operation of the assembled liquid crystal panel (liquid crystal cell) to complete the liquid-crystal display device. The above-described method of fabricating the liquid-crystal display device permits us to obtain the liquid-crystal display device with an extremely fine circuit pattern at high throughput.

The aforementioned embodiment was arranged to use the ArF excimer laser light source, but, without having to be limited to this, another appropriate light source is also applicable, for example, like an $F_2$ laser light source. The foregoing embodiment was the application of an embodiment of the present invention to the scanning exposure apparatus, but, without having to be limited to it, an embodiment of the present invention is also applicable to full-field exposure type exposure apparatus for performing the projection exposure in a state in which the reticle (mask) and wafer (photosensitive substrate) are kept in a stationary state relative to the projection optical system.

The foregoing embodiment was the application of an embodiment of the present invention to the liquid immersion type projection optical system mounted on the exposure apparatus, but, without having to be limited to it, an embodiment of the present invention is also applicable to any immersion objective optical system for making the first plane and the second plane optically conjugate with each other. In this case, Yi in Condition (3) represents the maximum image height on the second plane or the maximum object height on the second plane.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An immersion objective optical system for making a first plane and a second plane optically conjugate with each other,
wherein when a gas in the immersion objective optical system has a refractive index of 1 for used light, an optical path between the immersion objective optical system and the second plane is filled with a liquid having a refractive index larger than 1.5 for the used light,
the immersion objective optical system comprising a boundary optical element whose surface on the first plane side is in contact with the gas and whose surface on the second plane side is in contact with the liquid,
the immersion objective optical system satisfying the following condition:

$$3.2 < Nb \cdot Eb/|Rb| < 4.0,$$

where Rb is a radius of curvature of the surface on the first plane side of the boundary optical element, Eb an effective diameter of the surface on the first plane side of the boundary optical element, and Nb a refractive index for the used light, of an optical material forming the boundary optical element.

2. The immersion objective optical system according to claim 1, which satisfies the following condition:

$$0.12 < Yi/|Rb| < 0.3,$$

where Rb is the radius of curvature of the surface on the first plane side of the boundary optical element, and Yi a maximum image height on the second plane or a maximum object height on the second plane.

3. The immersion objective optical system according to claim 1, the immersion objective optical system having a field in a region located apart from the optical axis,
the immersion objective optical system comprising:
a first imaging optical system of a dioptric type located between a first conjugate position optically conjugate with the first plane, and the first plane;
a second imaging optical system located between a second conjugate position optically conjugate with the first conjugate position, and the first conjugate position and including at least one concave reflecting mirror; and
a third imaging optical system of a dioptric type located between the second conjugate position and the second plane.

4. The immersion objective optical system according to claim 3, wherein a folding mirror is located in at least one optical path out of an optical path from the first imaging optical system to the second imaging optical system and an optical path from the second imaging optical system to the third imaging optical system.

5. The immersion objective optical system according to claim 4, the immersion objective optical system being a projection optical system for forming a reduced image of the first plane on the second plane,
the immersion objective optical system satisfying the following conditions:

$$1.1 < |M1| < 1.7;$$

$$1.1 < |M12| < 1.7;$$

where M1 is an imaging magnification of the first imaging optical system and M12 a composite imaging magnification of the first imaging optical system and the second imaging optical system.

6. The immersion objective optical system according to claim 1, the boundary optical element having a refractive index larger than 2.0 for the used light when the gas in the immersion objective optical system has a refractive index of 1 for used light.

7. The immersion objective optical system according to claim 1, the boundary optical element being made of a crystalline material.

8. An exposure apparatus comprising the immersion objective optical system as defined in claim 1, for projecting an image of a predetermined pattern onto a photosensitive substrate set on the second plane, based on light from the pattern set on the first plane.

9. A device fabrication method comprising:
effecting exposure of the predetermined pattern on the photosensitive substrate by means of the exposure apparatus as defined in claim 8; and
developing the exposed photosensitive substrate.

10. An immersion objective optical system for making a first plane and a second plane optically conjugate with each other,
wherein when a gas in the immersion objective optical system has a refractive index of 1 for used light, an optical path between the immersion objective optical system and the second plane is filled with a liquid having a refractive index larger than 1.5 for the used light,
the immersion objective optical system comprising a boundary optical element whose surface on the first plane side is in contact with the gas and whose surface on the second plane side is in contact with the liquid,
the immersion objective optical system satisfying the following condition:

$$3.3 < Nb \cdot Sb/|Rb| < 4.15,$$

where Rb is a radius of curvature of the surface on the first plane side of the boundary optical element, Sb an outer diameter of the surface on the first plane side of the boundary optical element, and Nb a refractive index for the used light, of an optical material forming the boundary optical element.

11. The immersion objective optical system according to claim 10, which satisfies the following condition:

$$0.12 < Yi/|Rb| < 0.3,$$

where Rb is the radius of curvature of the surface on the first plane side of the boundary optical element, and Yi a maximum image height on the second plane or a maximum object height on the second plane.

12. The immersion objective optical system according to claim 10, the immersion objective optical system having a field in a region located apart from the optical axis,
the immersion objective optical system comprising:
a first imaging optical system of a dioptric type located between a first conjugate position optically conjugate with the first plane, and the first plane;
a second imaging optical system located between a second conjugate position optically conjugate with the first conjugate position, and the first conjugate position and including at least one concave reflecting mirror; and
a third imaging optical system of a dioptric type located between the second conjugate position and the second plane.

13. The immersion objective optical system according to claim 12, wherein a folding mirror is located in at least one optical path out of an optical path from the first imaging optical system to the second imaging optical system and an optical path from the second imaging optical system to the third imaging optical system.

14. The immersion objective optical system according to claim 13, the immersion objective optical system being a projection optical system for forming a reduced image of the first plane on the second plane,
the immersion objective optical system satisfying the following conditions:

$$1.1 < |M1| < 1.7;$$

$$1.1 < |M12| < 1.7;$$

where M1 is an imaging magnification of the first imaging optical system and M12 a composite imaging magnification of the first imaging optical system and the second imaging optical system.

15. The immersion objective optical system according to claim 10, the boundary optical element having a refractive index larger than 2.0 for the used light when the gas in the immersion objective optical system has a refractive index of 1 for used light.

16. The immersion objective optical system according to claim 10, the boundary optical element being made of a crystalline material.

17. An exposure apparatus comprising the immersion objective optical system as defined in claim 10, for projecting an image of a predetermined pattern onto a photosensitive substrate set on the second plane, based on light from the pattern set on the first plane.

18. A device fabrication method comprising:
effecting exposure of the predetermined pattern on the photosensitive substrate by means of the exposure apparatus as defined in claim 17; and
developing the exposed photosensitive substrate.

19. A boundary optical element which is used in an immersion objective optical system for making a first plane and a second plane optically conjugate with each other, and whose surface on the first plane side is able to be in contact with a gas and whose surface on the second plane side is able to be in contact with a liquid,
wherein when the gas has a refractive index of 1 for used light, the liquid on the second plane side of the boundary optical element has a refractive index larger than 1.5 for the used light,
the boundary optical element satisfying the following condition:

$$3.3 < Nb \cdot Sb/|Rb| < 4.15,$$

where Rb is a radius of curvature of the surface on the first plane side of the boundary optical element, Sb an outer diameter of the surface on the first plane side of the boundary optical element, and Nb a refractive index for the used light, of an optical material forming the boundary optical element.

20. The boundary optical element according to claim 19, which satisfies the following condition:

$$0.12 < Yi/|Rb| < 0.3,$$

where Rb is the radius of curvature of the surface on the first plane side of the boundary optical element, and Yi a maximum image height on the second plane or a maximum object height on the second plane of the immersion objective optical system.

21. The boundary optical element according to claim 19, the boundary optical element having a refractive index larger than 2.0 for the used light when the gas in the immersion objective optical system has a refractive index of 1 for used light.

22. The boundary optical element according to claim 19, the boundary optical element being made of a crystalline material.

23. A boundary optical element which is used in an immersion objective optical system for making a first plane and a second plane optically conjugate with each other, and whose surface on the first plane side is able to be in contact with a gas and whose surface on the second plane side is able to be in contact with a liquid, wherein when the gas has a refractive index of 1 for used light, the liquid on the second plane side of the boundary optical element has a refractive index larger than 1.5 for the used light, the boundary optical element satisfying the following condition:

$$3.2 < Nb \cdot Eb/|Rb| < 4.0,$$

where Rb is a radius of curvature of the surface on the first plane side of the boundary optical element, Eb an effective diameter of the surface on the first plane side of the boundary optical element, and Nb a refractive index for the used light, of an optical material forming the boundary optical element.

24. The boundary optical element according to claim 23, which satisfies the following condition:

$$0.12 < Yi/|Rb| < 0.3,$$

where Rb is the radius of curvature of the surface on the first plane side of the boundary optical element, and Yi a maximum image height on the second plane or a maximum object height on the second plane of the immersion objective optical system.

25. The boundary optical element according to claim 23, the boundary optical element having a refractive index larger than 2.0 for the used light when the gas in the immersion objective optical system has a refractive index of 1 for used light.

26. The boundary optical element according to claim 23, the boundary optical element being made of a crystalline material.

* * * * *

INTER PARTES REEXAMINATION CERTIFICATE (0290th)

United States Patent
Omura et al.

(10) Number: US 7,557,997 C1
(45) Certificate Issued: Aug. 9, 2011

(54) IMMERSION OBJECTIVE OPTICAL SYSTEM, EXPOSURE APPARATUS, DEVICE FABRICATION METHOD, AND BOUNDARY OPTICAL ELEMENT

(75) Inventors: Yasuhiro Omura, Kainosu (JP); Hironori Ikezawa, Fukaya (JP)

(73) Assignee: Nikon Corporation, Chiyoda-ku, Tokyo (JP)

Reexamination Request:
No. 95/001,527, Jan. 25, 2011

Reexamination Certificate for:
Patent No.: 7,557,997
Issued: Jul. 7, 2009
Appl. No.: 11/889,180
Filed: Aug. 9, 2007

Related U.S. Application Data

(60) Provisional application No. 60/847,611, filed on Sep. 28, 2006, and provisional application No. 60/878,071, filed on Jan. 3, 2007.

(51) Int. Cl.
*G02B 3/00* (2006.01)
*G02B 9/12* (2006.01)

(52) U.S. Cl. .................. 359/649; 359/651; 359/784
(58) Field of Classification Search .................. None
See application file for complete search history.

(56) References Cited

FOREIGN PATENT DOCUMENTS

| WO | 2004/019128 | 3/2004 |
|----|-------------|--------|
| WO | 2007/071569 | 6/2007 |

*Primary Examiner*—Christina Y Leung

(57) ABSTRACT

In a liquid immersion type projection optical system for forming an image of a first plane on a second plane, an optical path between the optical system and the second plane is filled with a liquid having the refractive index larger than 1.5, and the optical system has a boundary optical element whose surface on the first plane side is in contact with a gas and whose surface on the second plane side is in contact with the liquid. The optical system satisfies the condition of $3.2 < Nb \cdot Eb / |Rb| < 4.0$, where Rb is a radius of curvature of the surface on the first plane side of the boundary optical element, Eb an effective diameter of the surface on the first plane side of the boundary optical element, and Nb a refractive index for used light, of an optical material forming the boundary optical element.

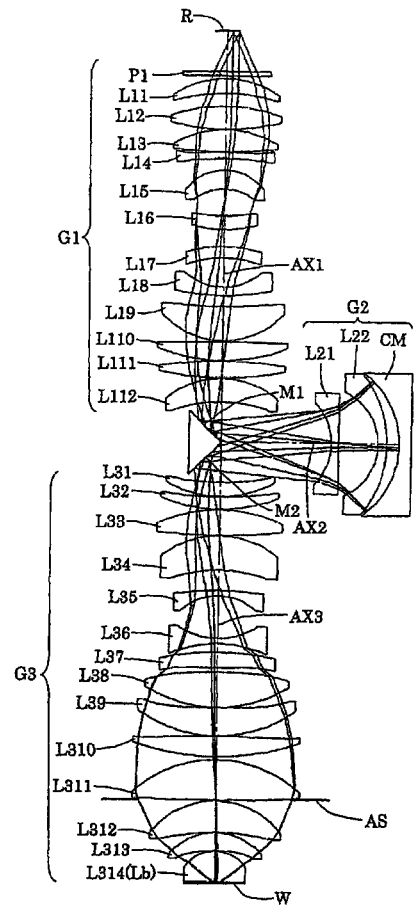

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-4, 6-13 and 15-26 are cancelled.
Claims 5 and 14 were not reexamined.

* * * * *